United States Patent [19]

Yagishita et al.

[11] Patent Number: 5,350,708

[45] Date of Patent: Sep. 27, 1994

[54] METHOD OF MAKING DYNAMIC RANDOM ACCESS SEMICONDUCTOR MEMORY DEVICE

[75] Inventors: Atsushi Yagishita; Katsuhiko Hieda, both of Yokohama; Akihiro Nitayama, Kawasaki; Fumio Horiguchi, Tokyo, all of Japan

[73] Assignee: Kabushiki Kaisha Toshiba, Kawasaki, Japan

[21] Appl. No.: 77,744

[22] Filed: Jun. 18, 1993

Related U.S. Application Data

[62] Division of Ser. No. 797,192, Nov. 25, 1991, Pat. No. 5,250,830.

[30] Foreign Application Priority Data

Nov. 30, 1990 [JP] Japan .................. 2-340402
Oct. 31, 1991 [JP] Japan .................. 3-286258

[51] Int. Cl.⁵ ............................................. H01L 21/70
[52] U.S. Cl. ................................... 437/52; 437/47; 437/48; 437/60
[58] Field of Search .............. 437/47, 48, 52, 60, 437/38; 257/303

[56] References Cited

U.S. PATENT DOCUMENTS 4,445,539  7/1989  Inoue .
5,192,704  3/1993  McDavid et al. ................ 437/52

FOREIGN PATENT DOCUMENTS 0186875  7/1986  European Pat. Off. .
54955    3/1987  Japan .
155557   7/1987  Japan .
40362    2/1988  Japan .
72150    4/1988  Japan .
248557   1/1989  Japan .
0006857  1/1991  Japan .
0025972  2/1991  Japan .

OTHER PUBLICATIONS

IBM TDB, vol. 32, No. 10B, Mar. 1990, pp. 179–181, High Density Tantalum Oxide Capacitor DRAM Cell Structure and Process Outline for G4MB DRAM Chips and Beyond.

Primary Examiner—Tom Thomas
Attorney, Agent, or Firm—Oblon, Spivak, McClelland, Maier & Neustadt

[57] ABSTRACT

A groove, which runs vertically and horizontally, is formed in a substrate, thereby a plurality of silicon pillars are formed in a matrix manner. A field oxidation film is formed on the central portion of the groove. A drain diffusion layer is formed on the upper portion of each silicon pillar, and a source diffusion layer is formed on the bottom portion of the groove. A gate electrode, serving as a word line, a storage node contacting the source diffusion layer, and a cell plate are sequentially buried to enclose the surroundings of each silicon pillar, and a bit line is formed in an uppermost layer, thereby a DRAM cell array is structured.

3 Claims, 19 Drawing Sheets

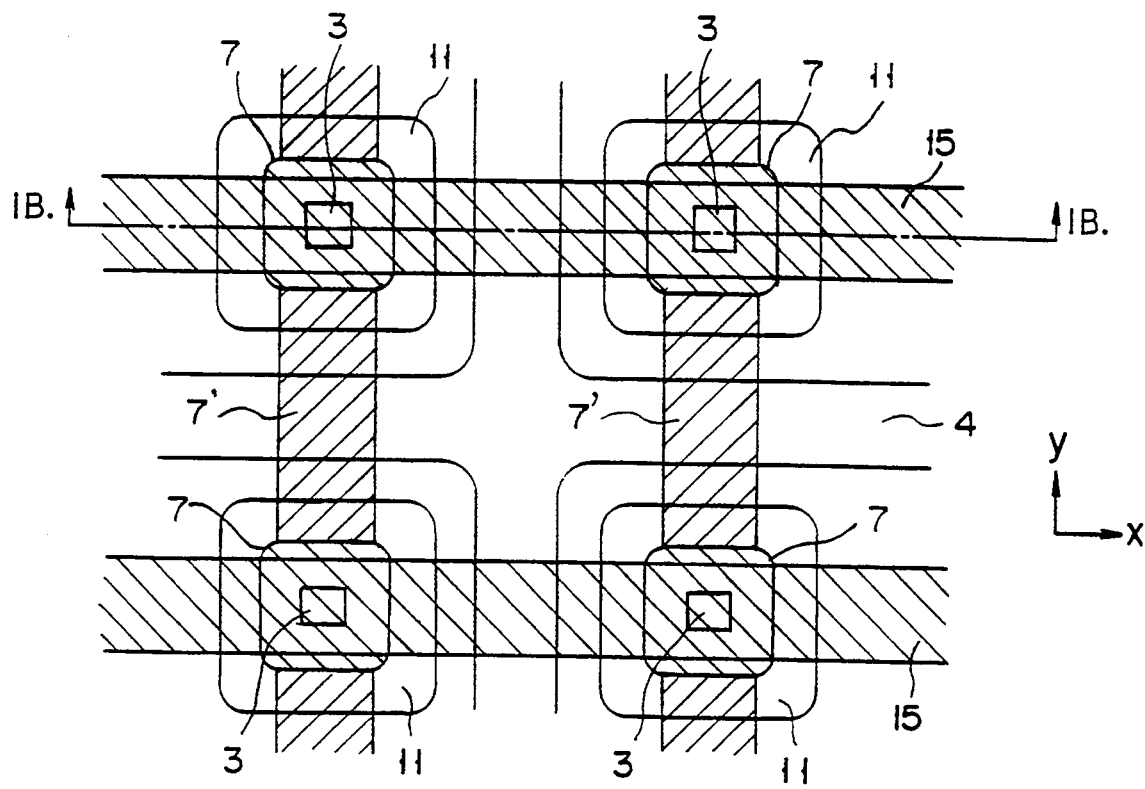
F I G. 1A
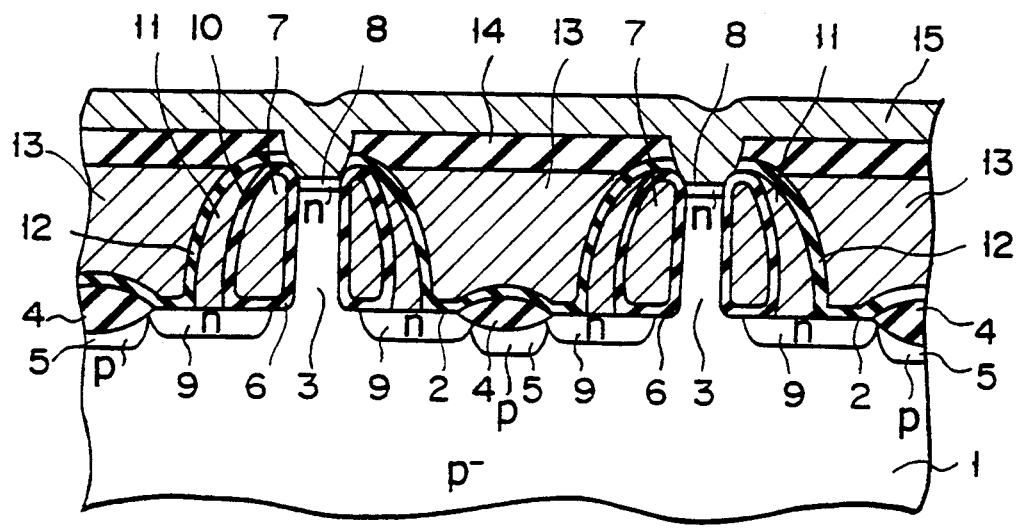
F I G. 1B

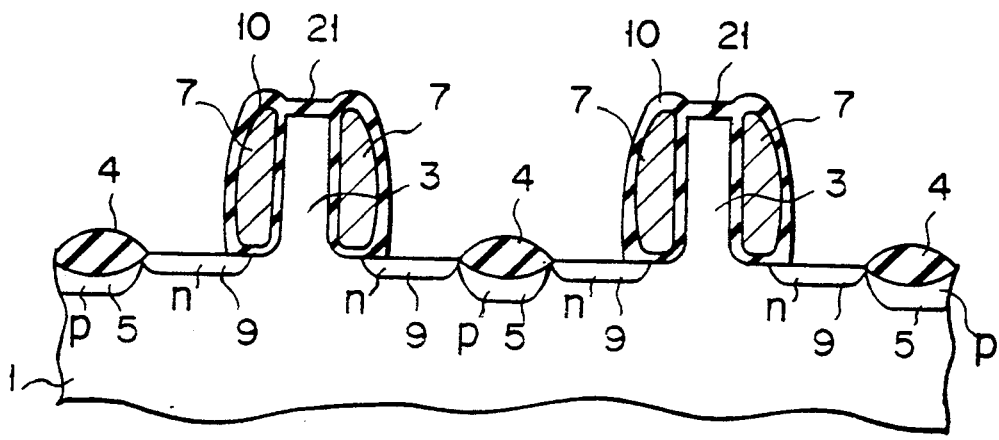
F I G. 2G
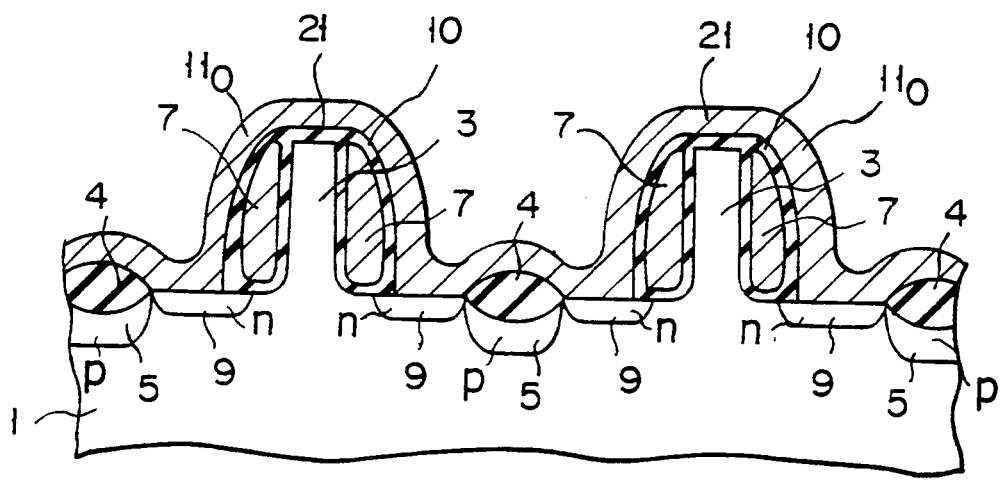
F I G. 2H

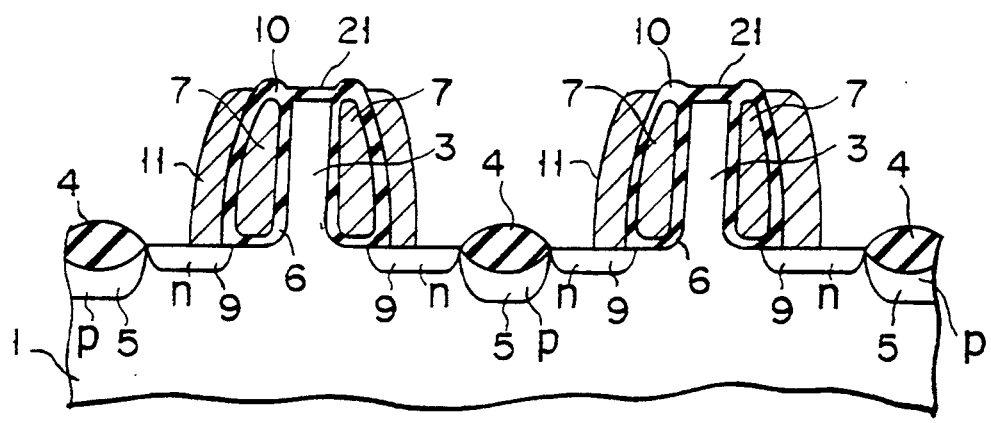
F I G. 2I
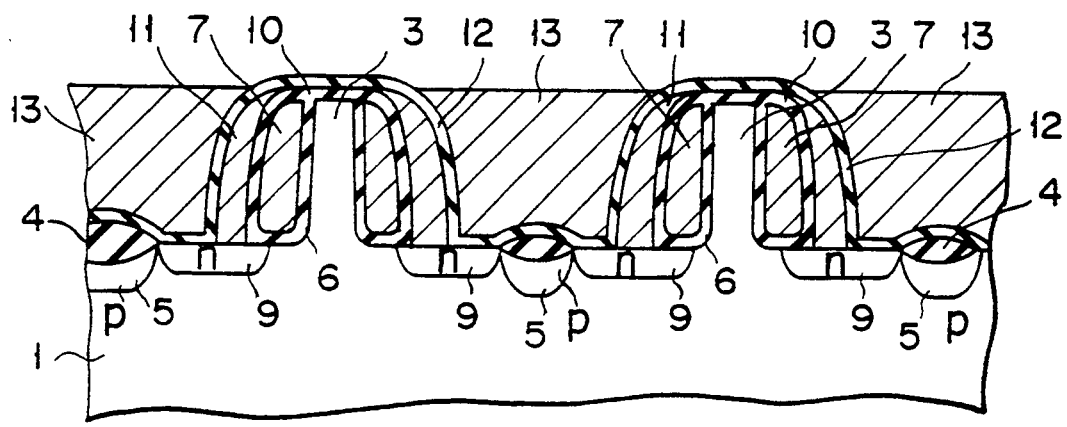
F I G. 2J
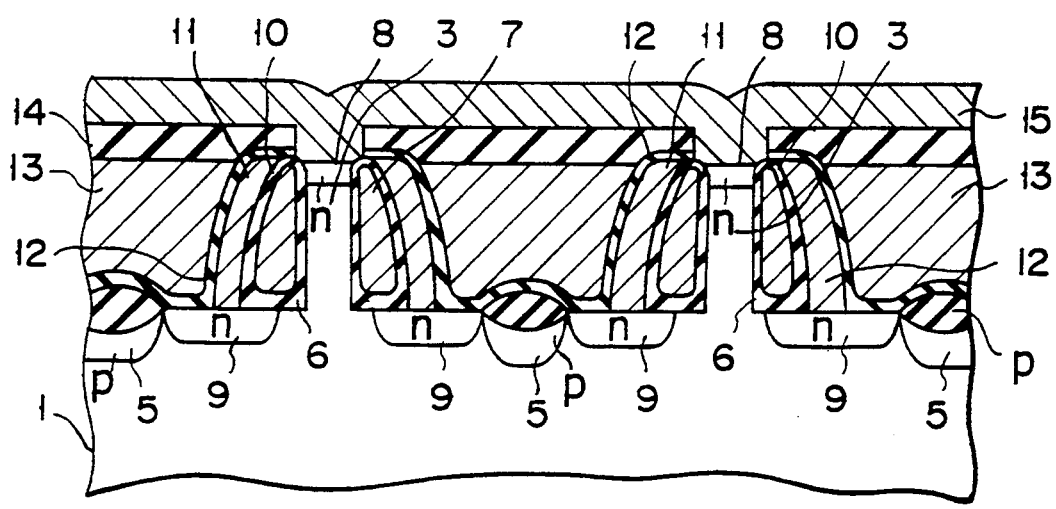
F I G. 2K

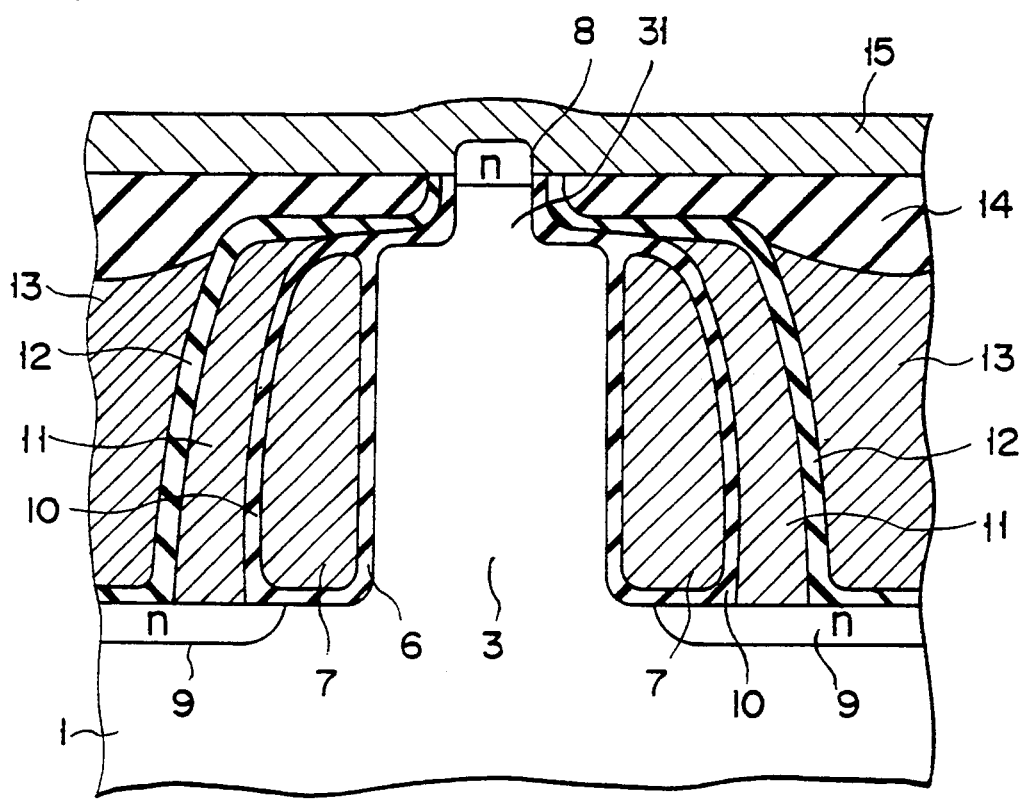
F I G. 3

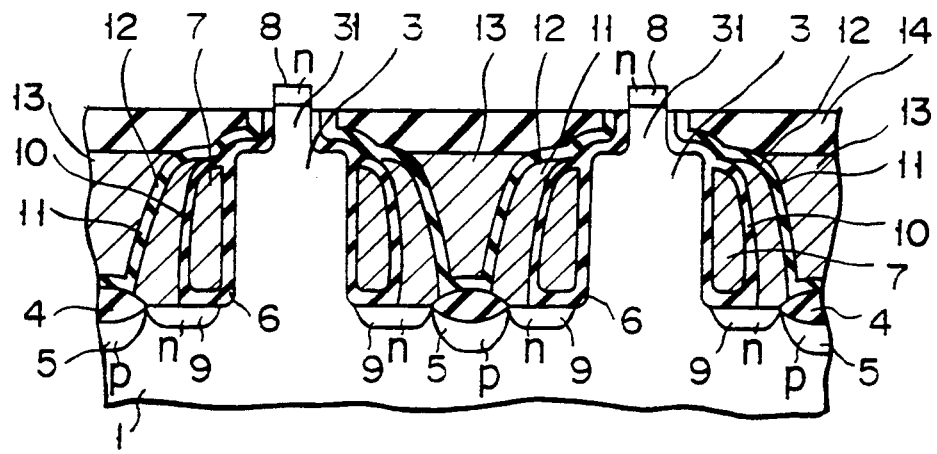
F I G. 4H
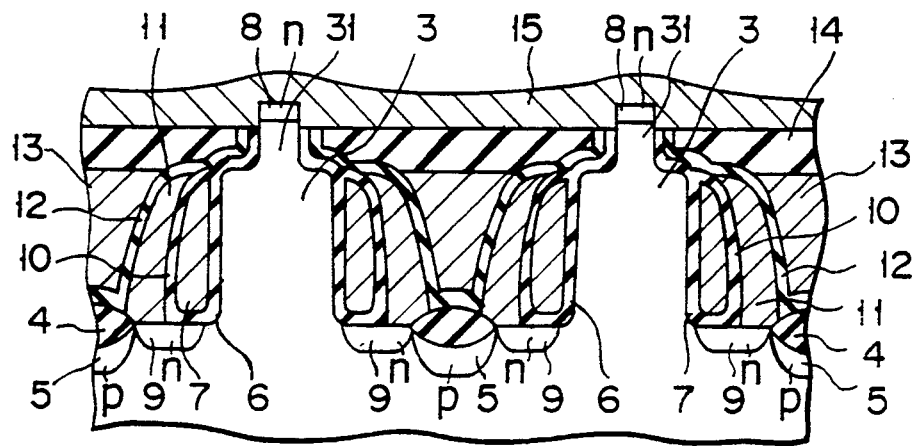
F I G. 4I

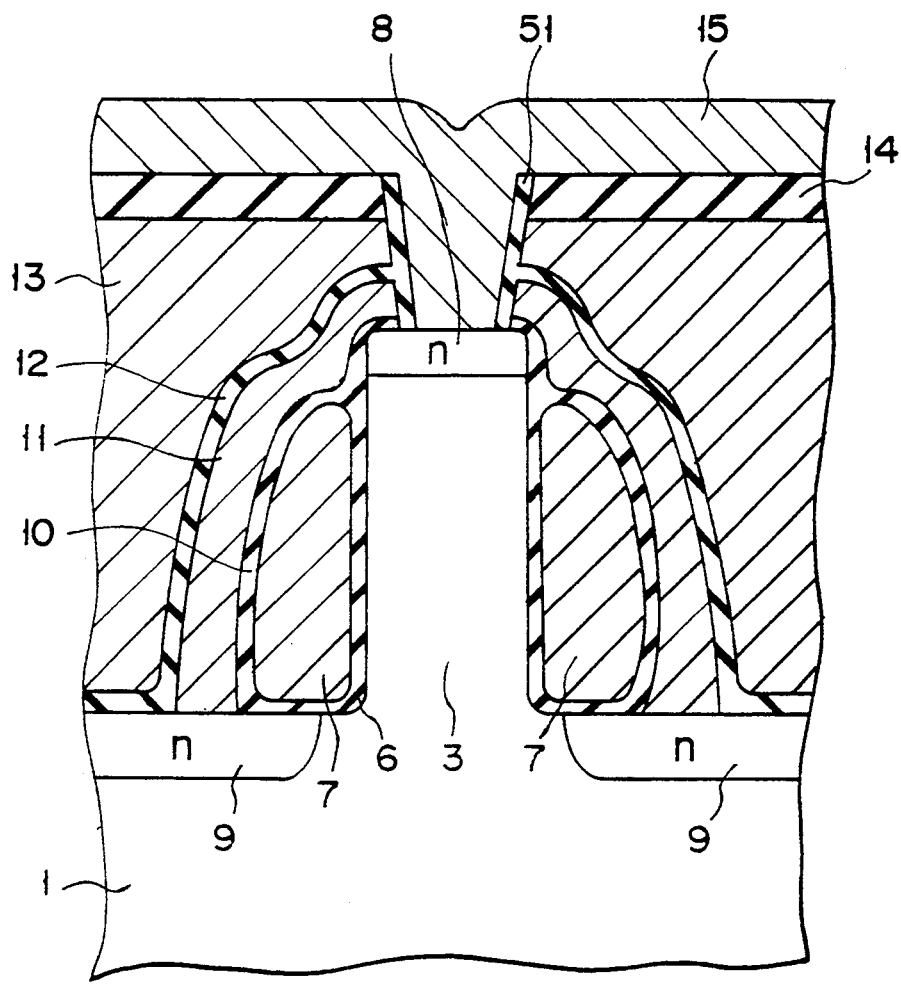
F I G. 5

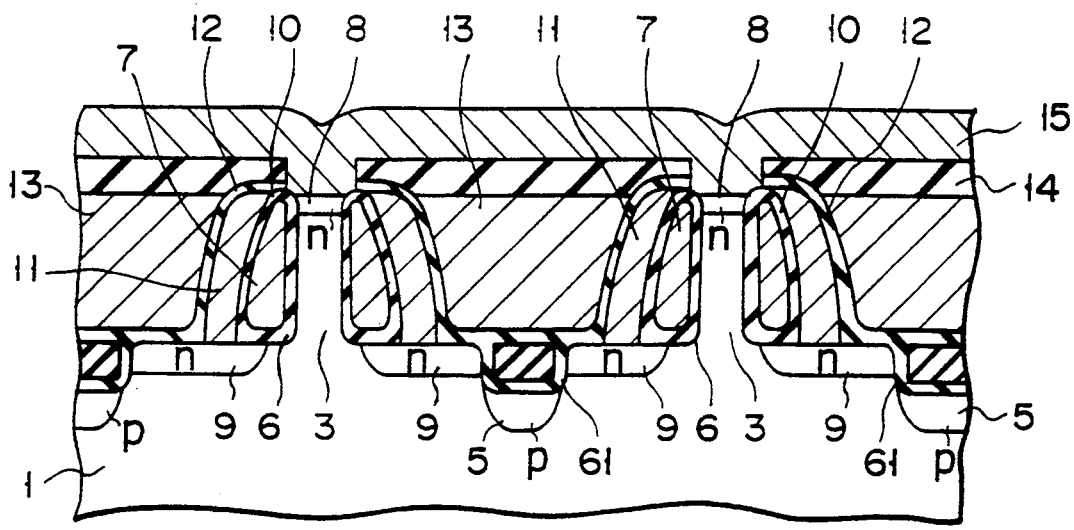
F I G. 6
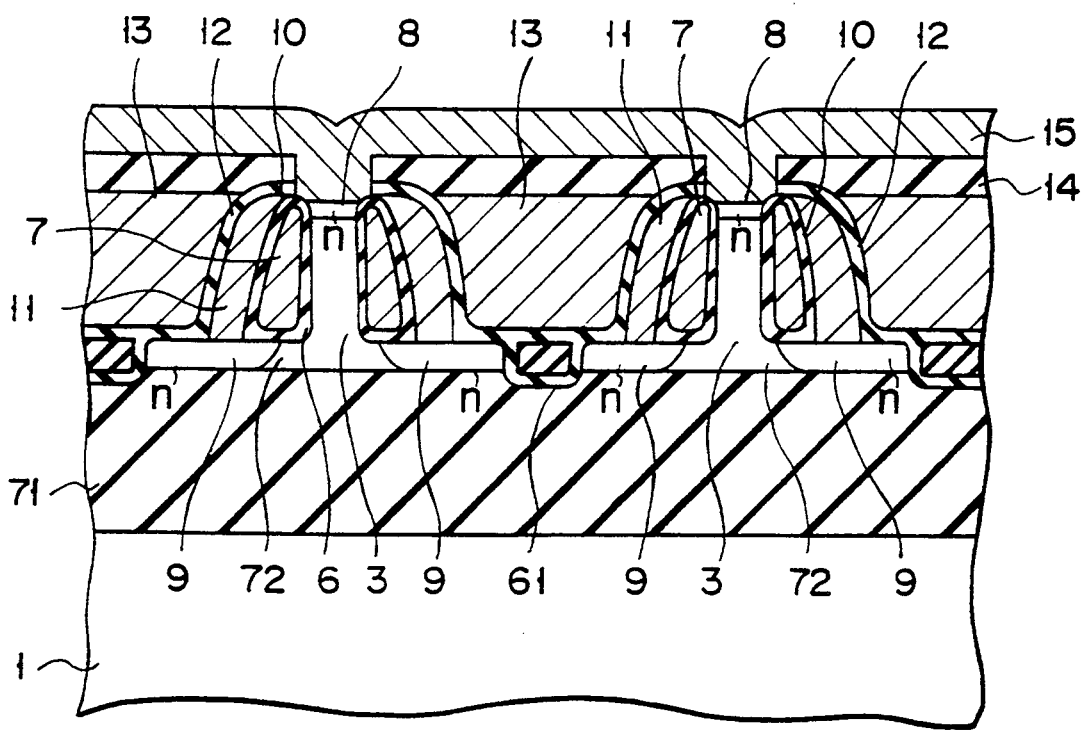
F I G. 7

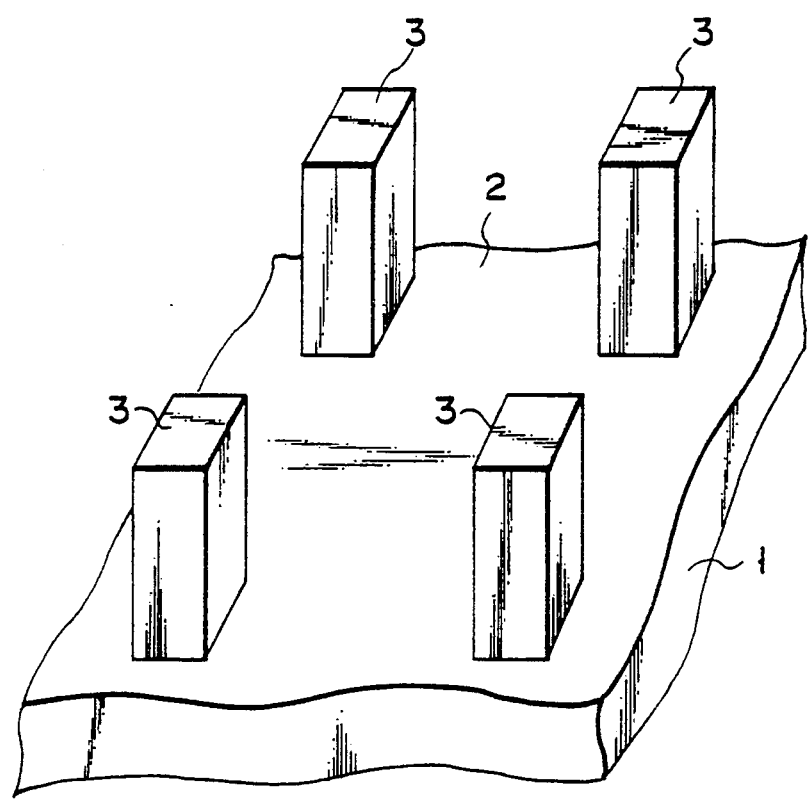
F I G. 9
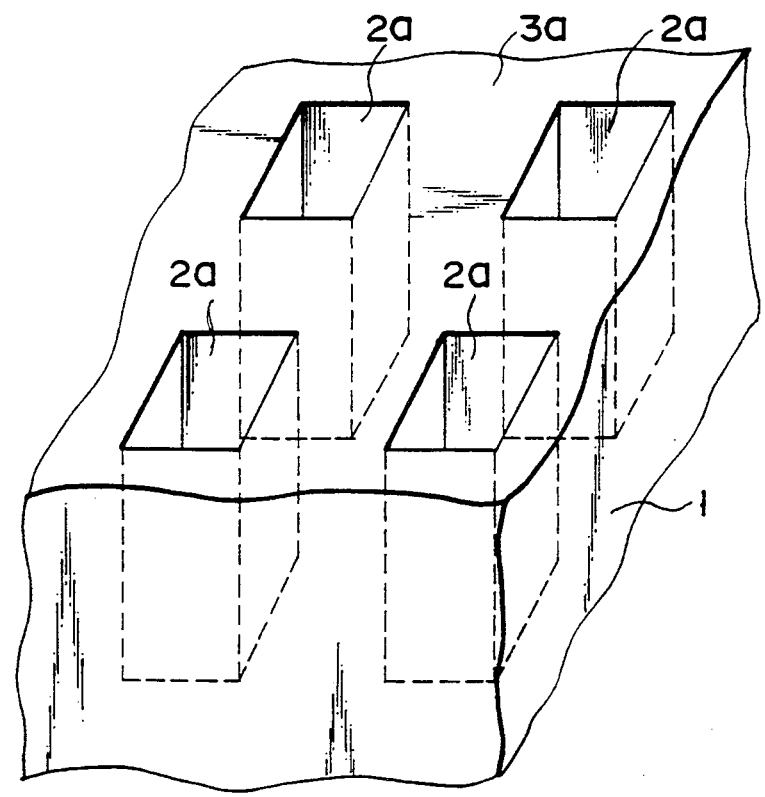
F I G. 10

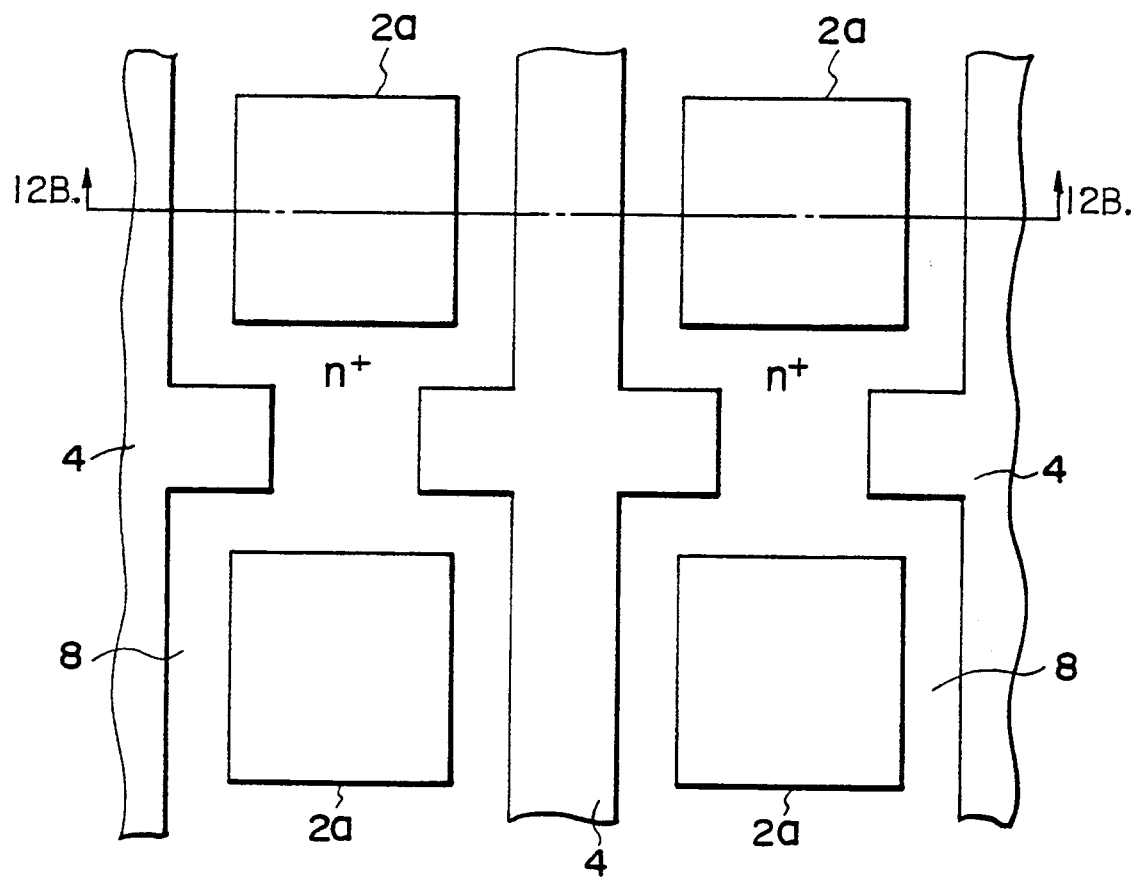
F I G. 12 A
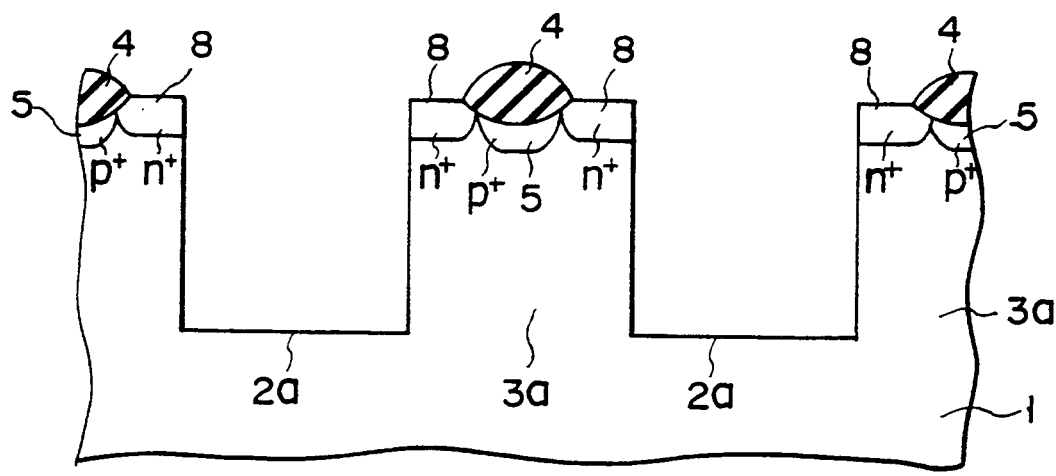
F I G. 12 B

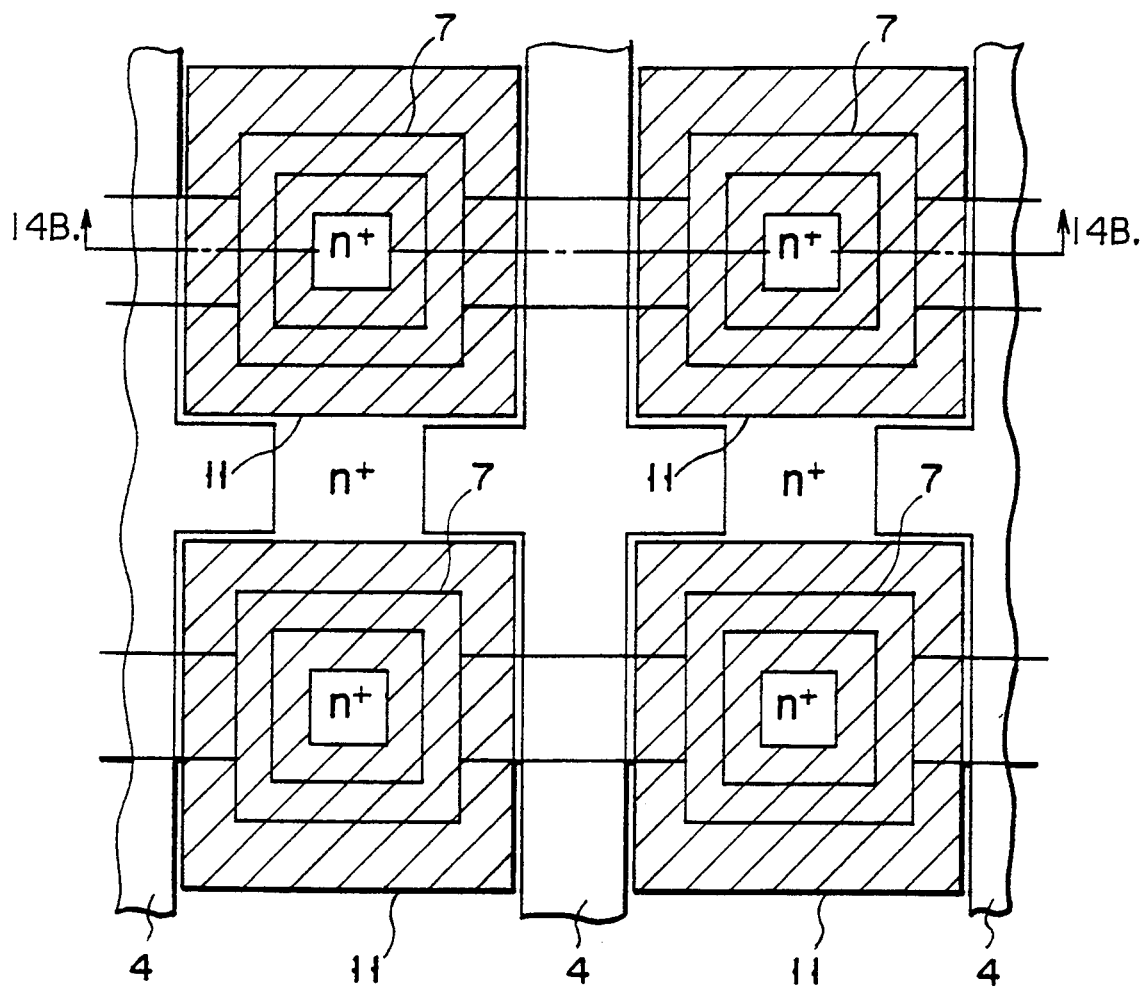
F I G. 14A
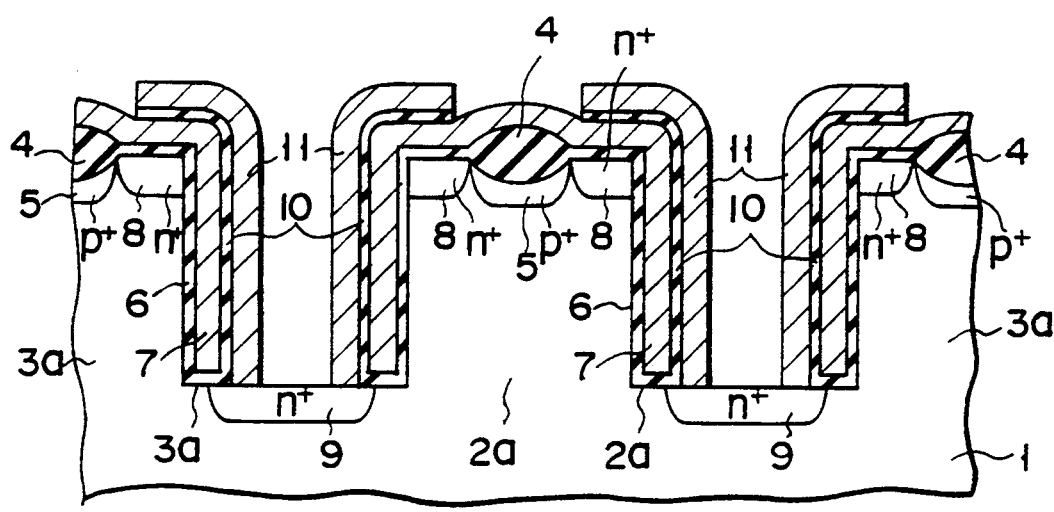
F I G. 14B

METHOD OF MAKING DYNAMIC RANDOM ACCESS SEMICONDUCTOR MEMORY DEVICE

This is a division of application Ser. No. 07/797,192, filed on Nov. 25, 1991, now U.S. Pat. No. 5,250,830.

BACKGROUND OF THE INVENTION

1. Field of the Invention

The present invention relates to a dynamic type semiconductor memory device (Dynamic Random Access Memory) wherein a memory cell is formed of a capacitor and a MOS transistor, and particularly to a DRAM wherein a memory cell is formed by use of semiconductor pillars, which are separated by groove and arrayed in a matrix manner, and its manufacturing method.

2. Description of the Related Art

A MOS type DRAM has been highly integrated by fining an element, and a capacity has been made large. As a DRAM structure, which is suitable for highly integrating the element and enlarging its capacity, there has been proposed a stacked cell structure in which a groove running horizontally and vertically in a semiconductor substrate and a plurality of semiconductor pillars are arrayed in a matrix manner, and a capacitor and a MOS transistor are vertically stacked on each semiconductor pillar (For example, see Published Unexamined japanese Application No. 60-152056.) According to this structure, a capacitor electrode (cell plate) is buried in the bottom of the groove, and a gate electrode is overlaid thereon so as to enclose the semiconductor pillar, thereby forming a memory cell. Since the capacitor and the MOS transistor are vertically stacked, an occupied area of the memory cell is small and the memory cell can be highly integrated.

However, in this structure, a groove having a depth of about 10 $\mu$m must be formed and there is required a process in which a film is vertically buried in the groove by a CVD method and stacked. Moreover, impurity diffusion must be performed on the side surface of the semiconductor pillar in order to form a diffusion layer serving as a storage node. For these reasons, a manufacturing process is complicated. Furthermore, since a deep groove must be formed in the substrate, distortion is easily generated in the substrate. Due to distortion of the substrate, a memory holding characteristic is easily deteriorated and soft error resisting worsens.

SUMMARY OF THE INVENTION

An object of the present invention is to provide a DRAM in which a manufacturing process is simple and a good memory holding characteristic can be obtained, and its manufacturing method.

The DRAM of the present invention comprises a semiconductor substrate; a plurality of semiconductor pillars arranged in a matrix manner by forming a groove vertically and horizontally in the substrate; an element separation region formed along the central portion of the groove; a MOS transistor having a gate electrode through a gate insulating film to surround each semiconductor pillar and source and drain diffusion layers each of these formed on the upper portion of the semiconductor pillar and a groove bottom portion; a storage node of a capacitor formed to be separated from the gate electrode by an interlayer insulating film and comes in contact with the diffusion layer of the groove bottom portion so as to surround the semiconductor pillar on which the gate electrode is formed; a cell plate buried in the groove through a capacitor insulating film opposed to the storage node; and a bit line formed to contact the upper diffusion layer of each semiconductor pillar.

The method for manufacturing the DRAM comprises the steps of forming a plurality of semiconductor pillars arranged in a matrix manner by forming a groove vertically and horizontally in the substrate; forming an element separation region formed along the central portion of the groove; forming a gate electrode surrounding the semiconductor pillar and continuing to a first direction of the matrix after forming a gate insulating film around each semiconductor pillar; forming a diffusion layer serving as a source region or a drain region in a groove bottom portion so as to surround the semiconductor pillar; forming a storage node of a capacitor to surround the semiconductor pillar on which the gate electrode is formed and to come in contact with the diffusion layer of the groove bottom portion after forming an interlayer insulating film on the surface of the gate electrode; burying a cell plate in the groove after forming a capacitor insulating film on the surface of the storage node; exposing an upper surface of the semiconductor pillar after covering the cell plate with the interlayer insulating film and forming a diffusion layer serving as a source region or a drain region in the exposed upper surface; and forming a bit line contacting the diffusion layer of the upper surface of the semiconductor pillar and continuing to the second direction of the matrix.

According to the present invention, the gate electrode of the MOS transistor, the storage node of the capacitor and the cell plate are all self-aligned and buried in the groove so as to surround the semiconductor pillar. Therefore, as compared with the conventional structure in which the cell plate and the gate electrode are vertically stacked, a deeper groove is not required, and distortion of the substrate lessens. As a result, an excellent memory holding characteristic can be obtained. Also, as compared with the general stack cell structure, excellent flatness can be obtained. Moreover, since the storage node is formed to enclose the surroundings of the gate electrode and the cell plate is formed to enclose the surroundings of the storage node, the capacitance of the capacitor is sufficiently large and has a small cell area. Since both the MOS transistor and the capacitor are vertically structured, the occupied area of the memory cell is sufficiently small and a highly integrated DRAM can be obtained.

Moreover, according to the present invention, the forming processes of the electrode, the storage node of the capacitor and the cell plate are all self-aligned, and the manufacturing process is simple.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 1A and 1B are plane views showing a DRAM structure of a first embodiment of the present invention and a cross sectional view taken along line A—A', respectively;

FIGS. 2A to 2K are cross sectional views showing the manufacturing processes of the DRAM of FIG. 1;

FIG. 3 is a cross sectional view showing a DRAM structure of a second embodiment of the present invention;

FIGS. 4A to 4I are cross sectional views showing the manufacturing processes of the DRAM of FIG. 3;

FIG. 5 is a cross sectional view showing a DRAM structure of a third embodiment of the present invention;

FIG. 6 is a cross sectional view showing a DRAM structure of a fourth embodiment of the present invention;

FIG. 7 is a cross sectional view showing a DRAM structure of a fifth embodiment of the present invention;

FIG. 9 is a view showing the shape of the processed substrate of the first to sixth embodiments;

FIG. 10 is a view showing a shape of a processed substrate of a next embodiment;

FIGS. 12A to 15B are plane views showing the manufacturing processes of the DRAM and their cross sectional views;

DETAILED DESCRIPTION OF THE PREFERRED EMBODIMENTS

Figure 2A:
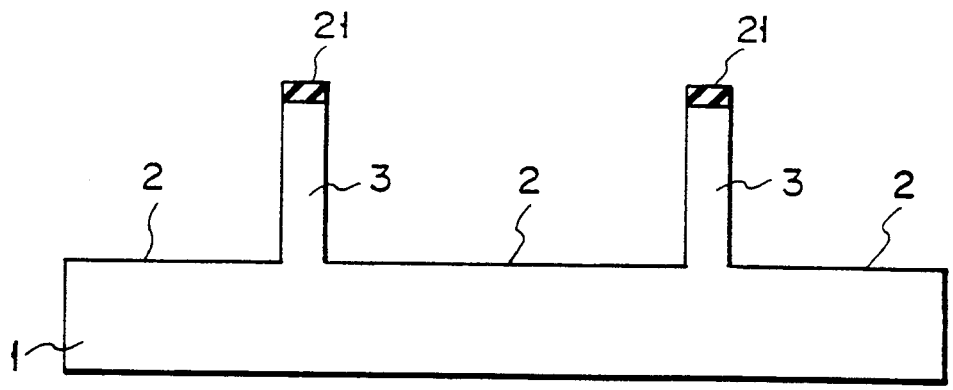

The embodiments of the present invention will be described with reference to the accompanying drawings.

FIGS. 1A and 1B are a plane view showing a 4-bit structure of a DRAM of a first embodiment of the present invention and a cross sectional view taken along line A—A', respectively. In a p-type (100) monocrystalline silicon substrate 1 (or a p-type well formed in an n-type substrate), there is formed a groove 2 running vertically and horizontally by use of reactive ion etching, so that silicon pillars 3 are arranged in a matrix manner. In the central portion of the groove 2, there are formed field oxidation films 4. P-type inversion preventing layers 5 are formed under the field oxidation films 4. Gate insulating films 6 are formed on a side wall of each silicon pillar 3, and gate electrodes 7 formed of a first layer polycrystalline silicon are arranged to surround the silicon pillars 3. On the upper surface of each silicon pillar 3 and a groove bottom portion therefore, there are formed n-type diffusion layers 8 and 9 serving as a source and a drain, respectively. Thus a MOS transistor of vertical type is structured in each silicon pillar 3. The n-type diffusion layers 9 of the groove bottom portion are separated from each other by the field oxidation films 4, and the diffusion layers 9 enclose each silicon pillar 3.

The gate electrodes 7 are formed to be continuous to a first direction (y-direction) of the matrix by a connecting section 7', and these are each used as a word line. The connecting section 7' is a first layer polycrystalline silicon which is the same as that of the gate 7, and the connecting section 7' is left in the groove bottom portion by use of a photoresist mask in an etching process in which the first polycrystalline silicon remains on the side wall of the silicon pillar 3.

An interlayer insulating film 10 is formed on the surface of each gate electrode 7. On the side surface of each gate electrode 7, there is formed a storage node 11 of a capacitor, which is formed of a second layer polycrystalline silicon, so as to surround each silicon pillar 3 similar to the gate electrodes 7. Each storage node 11 is used as an independent memory node for each silicon pillar 3, and comes in contact with each n-type diffusion layer 9 of the groove bottom portion. On the surface of each storage node 11, a capacitor insulating film 12 is formed. A cell plate 13 is buried in the grooves 2 to be opposite to the storage node 11. The cell plate 13 is continuous along the groove 2 running vertically and horizontally, and used as a capacitor electrode, which is common to all memory cells. By burying the cell plate 13, a wafer is made flat.

On the wafer, which was made flat by burying the gates 7, storage nodes 11 and the cell plate 13, an interlayer insulating film 14 is deposited. A bit line 15 is formed on the interlayer insulating film 14. The bit line 15 comes in contact with each n-type diffusion layer 8 of the upper portion of each MOS transistor. The bit line 15 is formed to be continuous in a second direction (x-direction) of the matrix.

FIGS. 2A to 2K are cross sectional views showing the manufacturing processes of the DRAM memory cell array of the above embodiment taken along the line A—A' The manufacturing processes will be explained in detail as follows.

As shown in FIG. 2A, on the p type silicon substrate 1, lamination films 21, which are formed of a CVD silicon oxidation film having thickness of 0.1 μm and a silicon nitride film, is deposited and patterned. The lamination films 21 are used as an etching mask, and the substrate 1 is etched by RIE, which is an anisotropic etching and a groove 2 running vertically and horizontally is formed. Thereby, silicon pillars 3 are arrayed in a matrix manner.

Figure 2B:
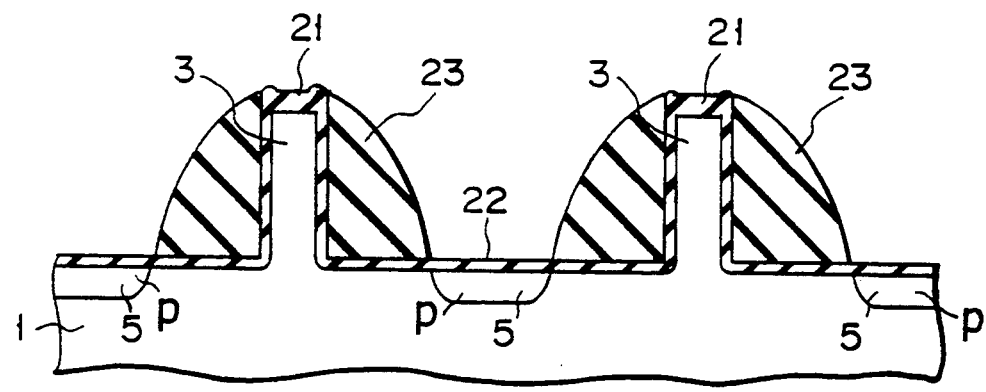

As shown in FIG. 2B, after forming a thermal oxidation film 22 having a thickness of 0.1 μm, silicon nitride films 23 having a thickness of 1 μm are deposited thereon by a CVD method. The entire silicon nitride films 23 are etched, thereby the silicon nitride films 23 remain on only the side walls of the silicon pillars 3. Thereafter, p-type layers 5 serving as inversion preventing layers are formed on the bottom portions of the groove 2 by ion implantation.

Figure 2C:
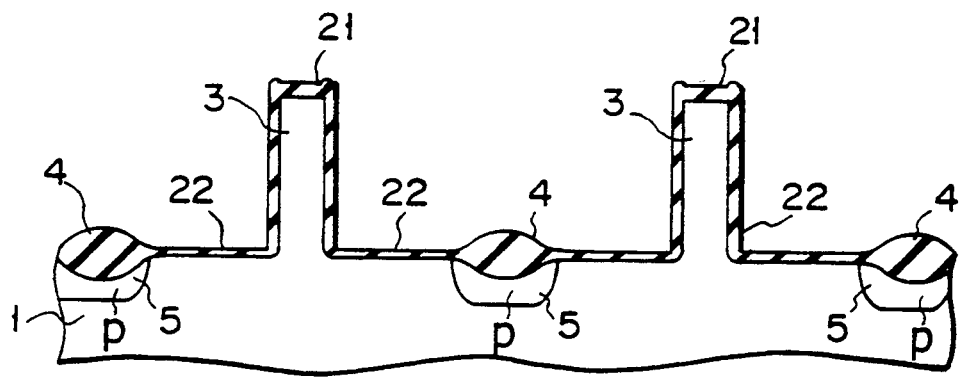

Then, the silicon nitride films 23 are used as protection masks and high temperature thermal oxidation is performed. As a result, as shown in FIG. 2C, field oxidation film 4 having a thickness of about 0.3 μm is formed. This element separation method is basically the same as the general LOCOS method.

Figure 2D:
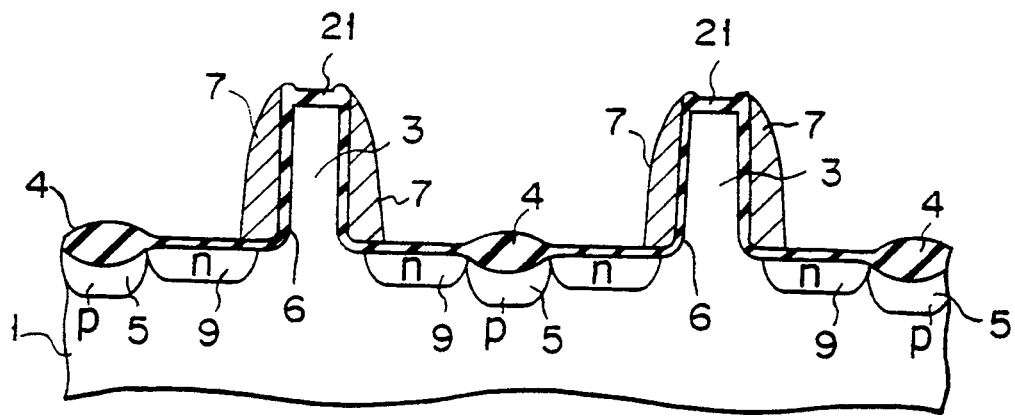

Next, the silicon nitride films 23 and the thermal oxidation film 22 under the films 23 are removed. Thereafter, as shown in FIG. 2D, a gate insulating film 6 having a thickness of 0.02 μm is formed around each silicon pillar 3 by thermal oxidation. Then, a first layer polycrystalline silicon film having a thickness of about 0.1 μm is deposited on the entire surface of the wafer, and etched by RIE. Thereby, the gate electrodes 7 are formed to surround the silicon pillars 3. In the RIE process, the photoresist pattern is formed in the connecting section 7' explained in FIG. 1 and the gate electrodes 7 are continuous in the y-direction. Thereafter, arsenic is ion-implanted and n-type diffusion layers serving as a source or a drain, are formed in the groove bottom portion.

Figure 2E:
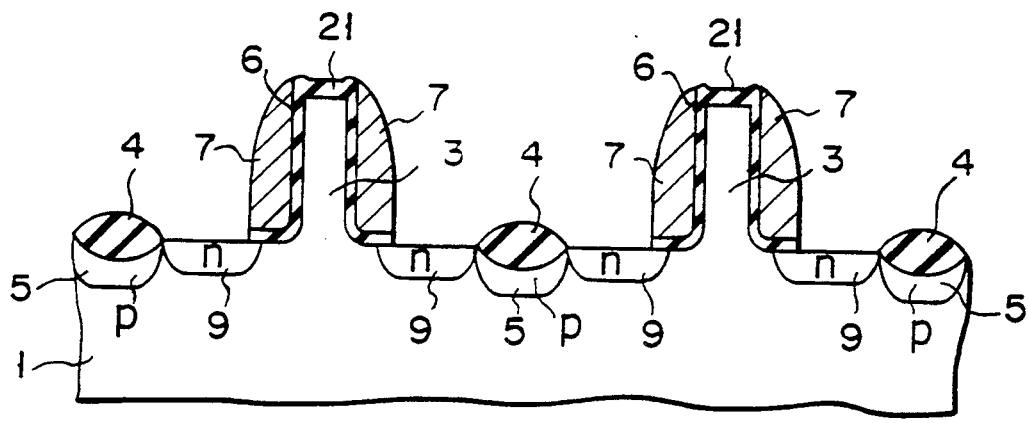
Figure 2F:
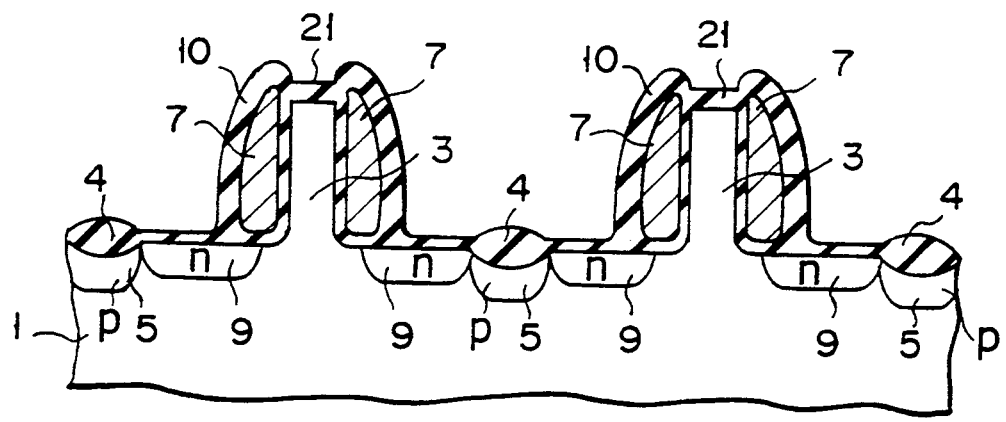

Then, as shown in FIG. 2E, thermal oxidation film etching is performed and the groove bottom portion is exposed, thereafter, thermal oxidation is performed again. Thereby, the surface of each gate electrode 7 is covered with an interlayer insulating film 10, which is formed of the oxidation film.

Thereafter, by etchant using NH$_4$F, the oxidation films on the n-type diffusion layers 9 in the groove bottom portion is removed as shown in FIG. 2G. Then, as shown in FIG. 2H, second layer polycrystalline silicon films 110 having a thickness of about 0.7 μm are deposited on the entire surfaces of the wafer. The polycrystalline films 110 are etched by RIE and storage nodes 11 of the capacitor are formed as shown in FIG. 2I. The storage nodes 11 are formed in a manner such that they enclose the gate electrodes 7 and are self-aligned with the gate electrodes 7. The storage nodes 11 come in contact with the n-type diffusion layers 9 of the groove bottom portion.

Thereafter, as shown in FIG. 2J, the capacitor insulating film 12 is formed on the surfaces of the storage nodes 11 and a third layer polycrystalline silicon is buried in the residual groove 2, so that the cell plate 13 is formed. The capacitor insulating film 12, for example, is an oxidized nitride film (reduced thickness of oxidation film is 0.005 μm) in which a silicon nitride film is deposited on the entire surface by CVD and the surface is oxidized. The third layer polycrystalline silicon is deposited and is made flat by, for example, photoresist. Thereafter, the entire surface of the third polycrystalline silicon is etched under a condition that the etching rate for the polycrystalline silicon and the photoresist equal, so that the cell plate 13 is flatly buried in the groove 2.

Thereafter, as shown in FIG. 2K, an interlayer insulating film 14 such as a CVD silicon oxidation film is deposited on the entire surface of the wafer. The interlayer insulating film 14 is etched by anisotropic etching and the upper surface of each silicon pillar 3 is exposed, and n-type diffusion layers 8 are formed in the exposed portion by ion-implantation of arsenic. Thereafter, the bit line 15 to be connected to the n-type diffusion layers 8 are formed by deposition of a conductive film such as an aluminum film and patterning.

According to the above embodiment, the gate electrodes 7 and the storage nodes 11 are sequentially formed around the silicon pillars 3 in a self-alignment manner, and the cell plate 13 is buried in the residual groove, so that the capacitor and MOS transistor are structured. Due to this, there is no need of the deep groove used in the conventional structure in which the capacitor and MOS transistor are vertically stacked in the groove. As a result, distortion generated in the substrate lessens and deterioration of the memory characteristic derived from distortion is controlled. Since both MOS capacitor and MOS transistor are vertically structured, the occupied area of the memory cell is small and a highly integrated DRAM can be obtained. Moreover, if the width of the silicon pillar 3 is made small to a certain extent, the silicon pillar is easily and completely depleted by a depletion layer extending from the surroundings of the silicon pillar to the inside of the silicon pillar. For this reason, channel controllability due to the gate electrodes is improved, and a subthreshold characteristic is improved. Moreover, influence of the substrate potential lessens.

In the method of the above embodiment, the process of forming each electrode requires few lithography processes, and each electrode can be formed around the silicon pillar in a self-alignment manner. Due to this, the manufacturing process of DRAM is simple and the process control is easily performed.

Next, the other embodiments will be explained as follows.

In the following embodiments, the same reference numerals as the first embodiment are added to the portions corresponding to those of the first embodiment.

FIG. 3 is a cross sectional view showing the structure of the portion of 1 memory cell of DRAM of a second embodiment.

In this embodiment, a projection 31 having a narrowed diameter is formed in the upper portion of the silicon pillar 3. An n-type diffusion layer 8 is formed on the upper surface portion of the projection 31. Though this structure will be explained in the manufacturing process to be described later, there is no need of lithography process such that the bit line 15 is brought into contact with the n-type diffusion layer 8, and such contact can be made in a self-alignment manner.

FIGS. 4A to 4I are cross sectional views showing the manufacturing processes.

Figure 4A:
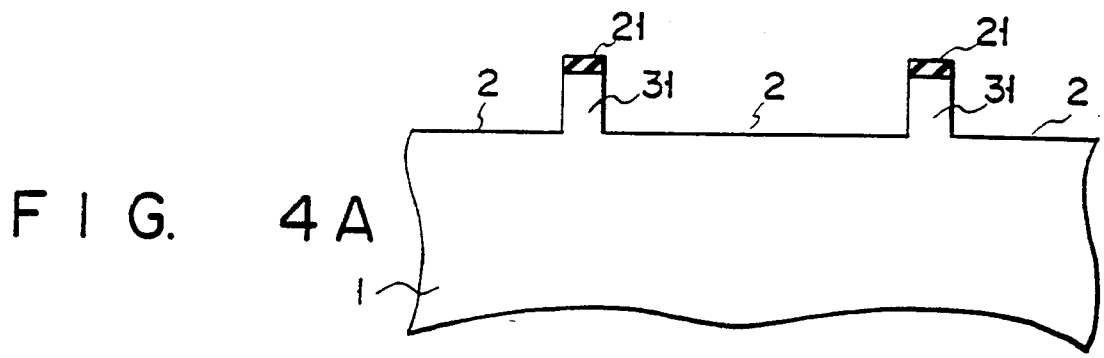
Figure 4B:
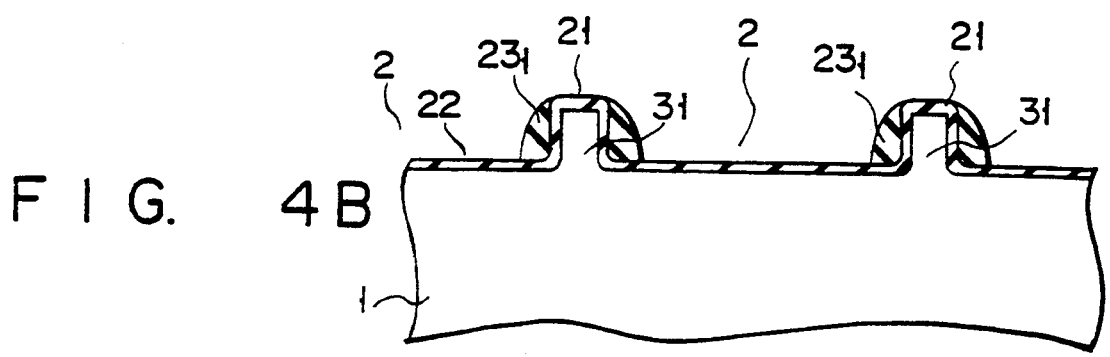
Figure 4C:
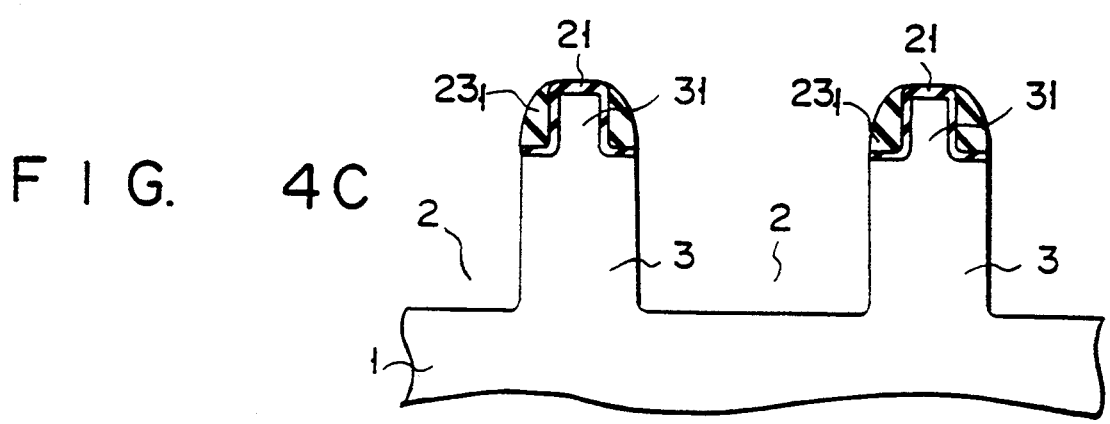

As shown in FIG. 4A, on a p-silicon substrate 1, a plurality of lamination masks 21, are formed of a silicon oxidation film and silicon nitride film, so that the substrate is etched by anisotropic etching and shallow groove 2 is formed. Thereby, projections 31 are formed. Then, as shown in FIG. 4B, a silicon oxidation film 22 is formed by thermal oxidation, thereafter, a silicon nitride film 231 is formed on the side wall of each projection 31. The lamination mask 21 and the nitride films 231 are used as a mask and the substrate 1 is further etched by isotropic etching. As a result, as shown in FIG. 4C, the groove 2 is deeply formed. Thereby, there can be obtained silicon pillars 3, which have projections 31 whose diameter is small on their upper portions.

Figure 4D:
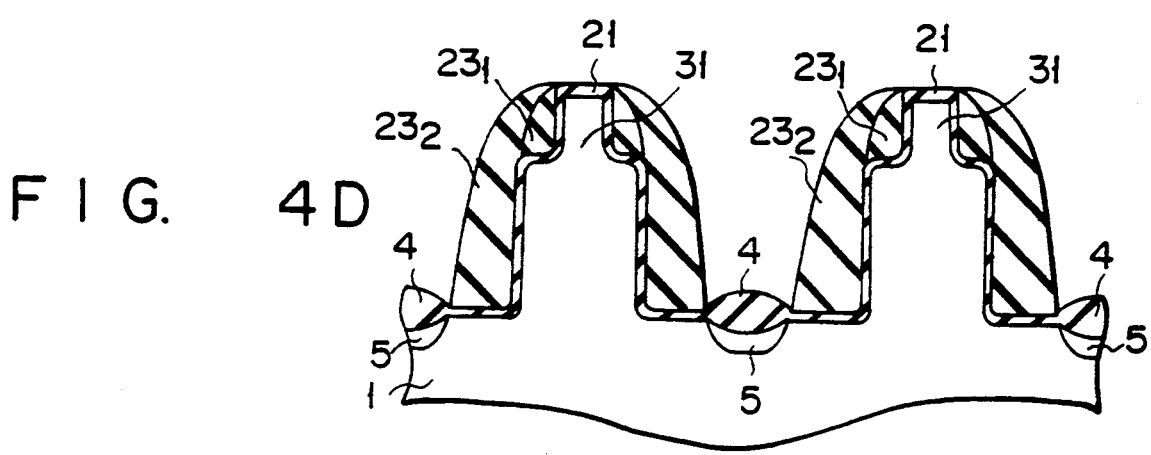

Thereafter, silicon nitride films 232 are formed on the side walls of the silicon pillars 3 again, and thermal oxidation is performed. Thereby, field oxidation films 4, as shown in FIG. 4D, are formed. Under the field oxidation film 4, there are formed separation p-type layers 5 similar to the previous embodiment.

Figure 4E:
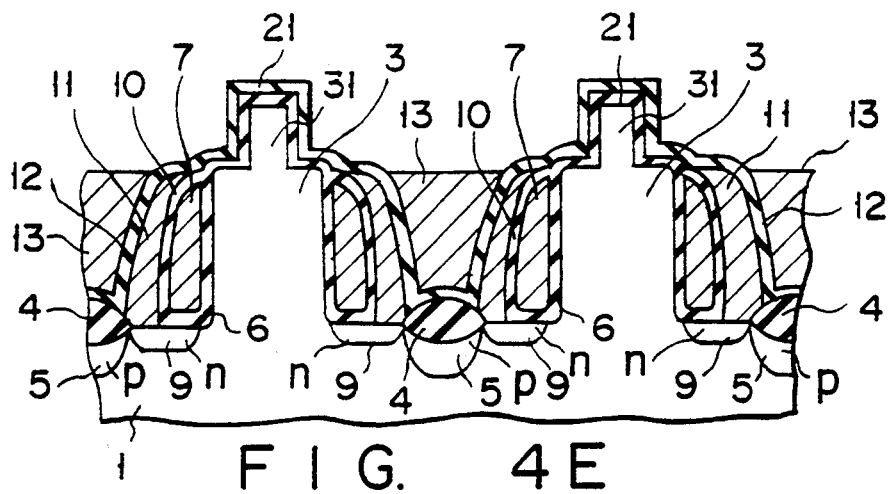
Figure 4F:
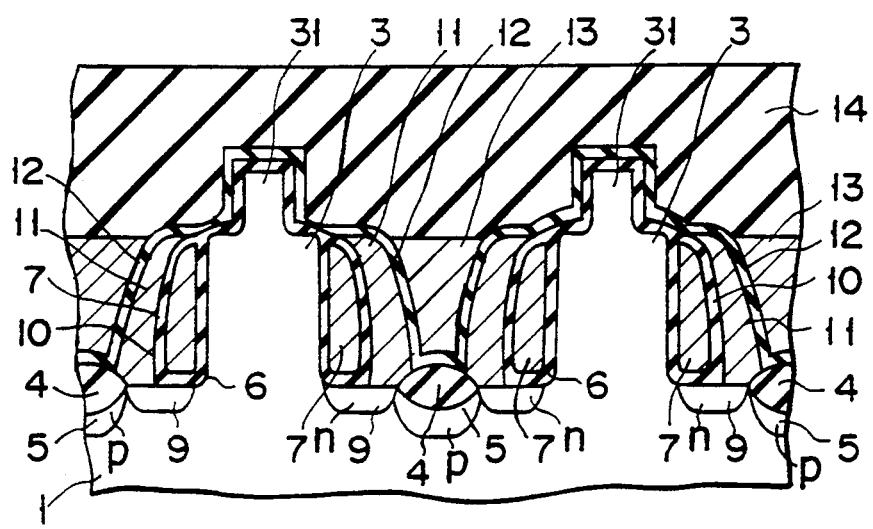
Figure 4G:
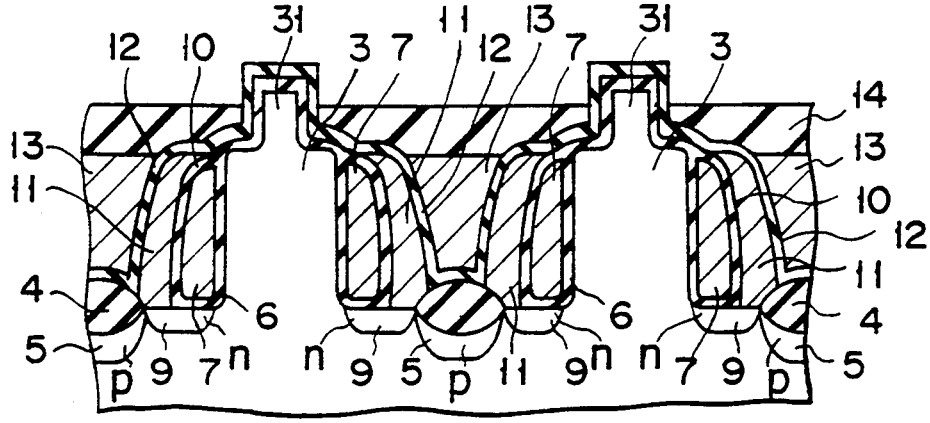

Thereafter, the same process as that of the first embodiment is performed, and the gate electrodes 7, n-type diffusion layers 9, the storage node 11 and the cell plate 13 are sequentially formed as shown in FIG. 4E. In this case, as shown in FIG. 4E, the gate electrodes 7, the storage node 11 and the cell plate 13 are formed on the portions, which are lower than the projections 31 of the upper portions of the silicon pillars 3. Then, as shown in FIG. 4F, a CVD silicon oxidation film 14 is deposited on the entire surface of the wafer such that the surface is made flat. The silicon oxidation film 14 is etched, thereby there can be obtained a state that the projections 31 are exposed as shown in FIG. 4G. Similar to the first embodiment, the photoresist may be used in order to make the surface of the silicon oxidation film 14 flat.

Then, as shown in FIG. 4H, the insulating film coating the surfaces of the exposed projections 31 is removed and impurity material is doped on the exposed surfaces, so that the n-type diffusion layers 8 are formed. Thereby, there can be obtained a state that the surface of the n-type diffusion layer 8 of each silicon pillar 3 is exposed without using the lithography process. Thereafter, the bit line 15 is formed by deposition of, for example, an aluminum film and patterning as shown in FIG. 4I.

According to the above-mentioned embodiment, the bit line contact portion can be formed in a self-alignment manner without using the lithography process.

FIG. 5 shows the structure of DRAM memory cell of a third embodiment. In this embodiment, the storage node 11 of the capacitor is formed to cover not only the side surface of the gate electrode 7 but also the upper surface of the gate electrode 7 and the upper surface of the silicon pillar 3. The cell plate 13 is thickly formed to cover the portions from the side surface of the storage node 11 up to the surface of the storage node 11.

More specifically, in order to obtain the above-mentioned structure, for example, the upper portion of the silicon pillar 3 is masked such that the polycrystalline silicon is not etched at the time of etching to pattern the storage node 11 of the capacitor, which is formed of the second layer polycrystalline silicon film. The cell plate 13 is buried to cover the portion up to the silicon pillar 3. Thereby, the second layer polycrystalline silicon film and the third layer polycrystalline silicon film are left on the upper portion of the silicon pillar 3 in depositing the silicon oxidation film 14. The second layer polycrystalline silicon film is left on the upper portion of each silicon pillar 3. However, the second layer polycrystalline silicon film is separated between the adjacent silicon pillars similar to the previous embodiment. Then, a contact hole is opened in the interlayer insulating film 14, and the third layer polycrystalline silicon film and the second polycrystalline silicon under the interlayer insulating film 14 are etched and removed. Thereafter, the n-type diffusion layer 8 is formed on the upper portion of the silicon pillar 3. Then, an insulating film 51 is formed on the side surface of the polycrystalline silicon film exposed to the contact hole. Therefore, the bit line 15 contacting the n-type diffusion layer 8 is formed.

According to the above embodiment, the area of the capacitor opposing the electrode becomes larger than that of the side surface of the gate electrode. Due to this, a large capacitance of the capacitor can be obtained. The occupied area of the memory cell is the same as the previous embodiment. Therefore, there can be obtained a DRAM, which can be highly integrated and has an excellent characteristic.

FIG. 6 shows the structure of the DRAM memory of a fourth embodiment. In this embodiment, there is no use of a thick element separation oxidation film by a LOCOS. On the central portion of the groove 2, there is formed a separation groove 61 and, thereby an element separation is performed. It is preferable that p-type layers 5 be formed under the separation groove 61 as shown in the drawing.

In this embodiment, after the process of forming the groove 2 to form the silicon pillars 3, the separation groove 61 is further formed in the central portion of the groove 2 and material having low stress is buried therein. The surfaces of the separation groove 61 are covered with the insulating film. The material to be buried in the groove 61 may be an insulating material of the oxidation film base or a nitride film. In a case where the conductive film such as polysilicon is buried, the surface of the groove 61 is coated with the insulating film.

FIG. 7 shows the structure of the DRAM memory of a fifth embodiment. In this embodiment, an SOI structure is used. More specifically, on the silicon substrate 1, there is formed a silicon oxidation film 71 and p-type silicon layers 72 are formed thereon. Similar to the embodiment of FIG. 6, the separation groove 61 is formed in the element separation region.

Figure 8:
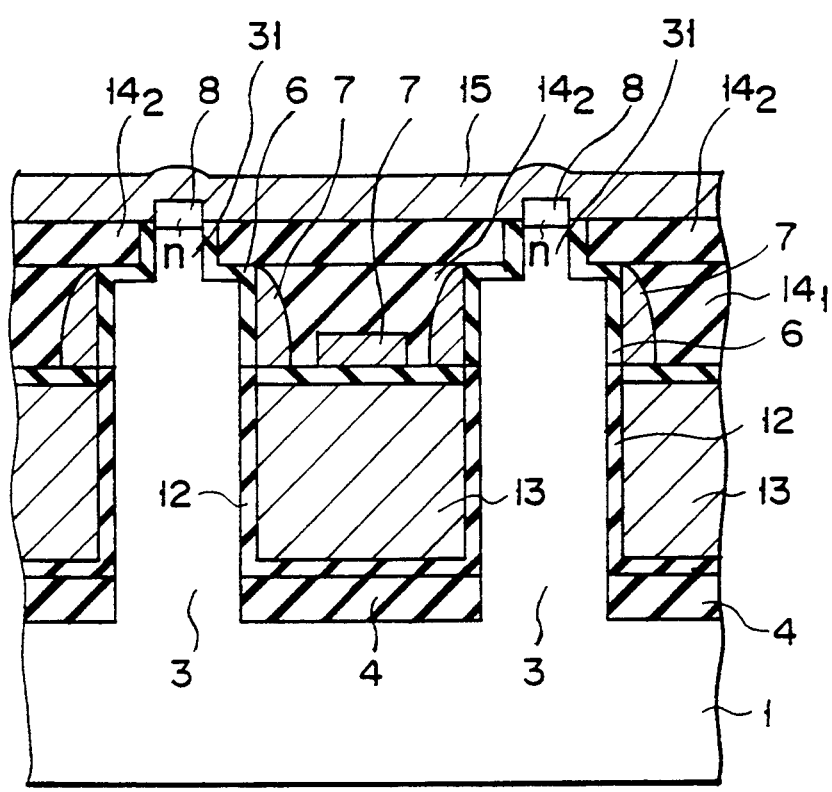
FIG. 8 is a cross sectional view showing a DRAM structure of a sixth embodiment of the present invention.

FIG. 8 shows the structure of the DRAM memory of a sixth embodiment. In this embodiment, unlike the above-mentioned embodiments, a conventional vertical stacking structure is used. That is, the cell plate 13 is buried in the bottom portion of the groove, and the gate electrode 7 of the MOS transistor is stacked on the cell plate 13. In this embodiment, the self-aligned contact of the bit line as explained in the embodiment of FIG. 3 is applied to the conventional vertical stacking structure.

In this embodiment, a deeper groove is required as compared with the first to fifth embodiments. However, there can be obtained a technical advantage in which the bit line 15 can be brought into contact with the n-type diffusion layer 8 without using PEP process.

In the above-mentioned embodiments, the silicon substrate 1 is processed as shown in FIG. 9. More specifically, the substrate is processed to obtain the state that the groove 2 runs vertically and horizontally. Thereby, a plurality of silicon pillars 3 are arrayed. Then, the gate electrodes, storage nodes, and the cell plate are sequentially buried in order to surround each silicon pillar 3.

In the embodiments to be explained later, the relationship between the concave and convex portions of the substrate to be initially processed is opposite to the above-mentioned embodiments 1 to 6. More specifically, as shown in FIG. 10, a plurality of grooves 2a are formed in each element region of the silicon substrate 1. A silicon layer 3a, which is positioned in the outside of the grooves 2a, is continuous to the vertical and horizontal directions. Then, the gate electrode, the storage node, and the cell plate are sequentially buried in each groove 2a.

Figure 11A:
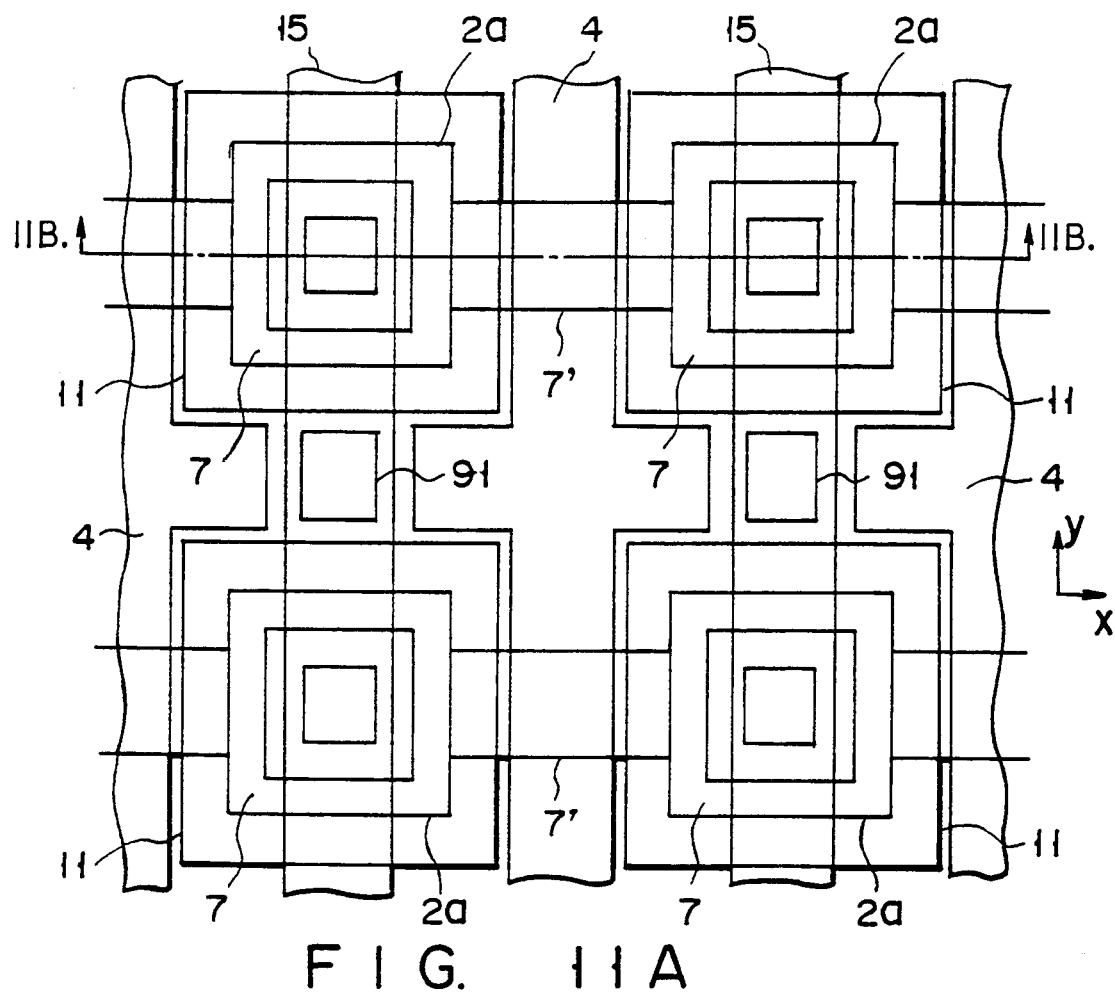
FIGS. 11A and FIG. 11B are a plane view showing a DRAM structure of a seventh embodiment of the present invention and a cross sectional view taken along line A—A', respectively.
Figure 11B:
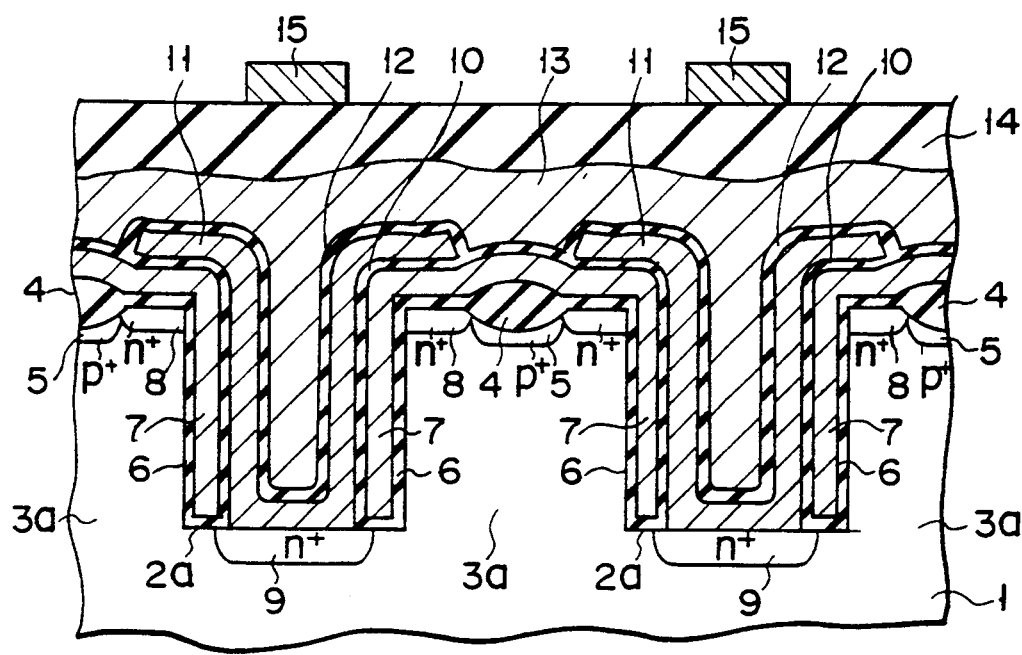

FIGS. 11A to 11B are respectively a plane view showing a DRAM structure of a seventh embodiment using the above-mentioned processed substrate and a cross sectional view taken along line A—A'. In these drawings, the same reference numerals as FIGS. 1A and 1B are added to the portions corresponding to those of FIGS. 1A and 1B. In the central portion of the silicon layer 3a forming a convex portion, there is formed a field oxidation film 4 in a substantially stripe shape by LOCOS method. Each groove 2a is an element region, and the gate electrode 7, the storage node 11, and the cell plates 13 are sequentially buried therein. The gate electrode 7 of each memory cell is continuous in the x-direction by the connection section 7' and this is used as a word line. On the entire bottom surface of each groove 2a, there is formed the n type diffusion layer 9 to be connected to the storage node 11. The n-type diffusion layer 8, serving as a bit line, is formed in the outside of the groove 2a. As mentioned above, the vertical type MOSFET is formed in each groove 2a. The n-type diffusion layer 8, serving as a drain of MOSFET and a bit line, is formed to enclose each groove 2a and continuous the y-direction. On the uppermost portion, an Al bit line 15 is formed. The Al bit line 15 is provided for an auxiliary object in order to reduce resistance of the bit line formed of the n-type diffusion layer 8, and the Al bit line 15 is connected to the n-type diffusion layer 8 at the contact section 91.

The specific manufacturing process of the DRAM of this embodiment with reference to FIGS. 12A, 12B to 15A and 15B will now be described. As shown in FIGS. 12A and 12B, on the silicon substrate 1, a field oxidation film 4 running vertically and horizontally in substantially a stripe manner in the y-direction is formed by LOCOS method. Under the field oxidation film 4, there is formed a p-type layer 5, which is used as an inversion preventing layer, in advance. The n-type diffusion layer 8, which serves as the drain of he MOSFET and the bit line, is formed on the entire surface of the region, which is enclosed with the field oxidation film 4. Thereafter, the groove 2a is formed in each memory cell region. The size of the groove 2a is set to be smaller than that of the region, which is enclosed with the field oxidation film 4, such that the n-type diffusion layer 8 is left around the n-type diffusion layer 8. In the process of the groove 2a, for example, a CVD oxidation film (not shown) is used as an etching mask and the groove 2a is processed by RIE. By the process of the groove 2a, the n-type diffusion layer 8 is patterned to enclose the surroundings of each groove 2a and to be continuous in the y-direction.

Figure 13A:
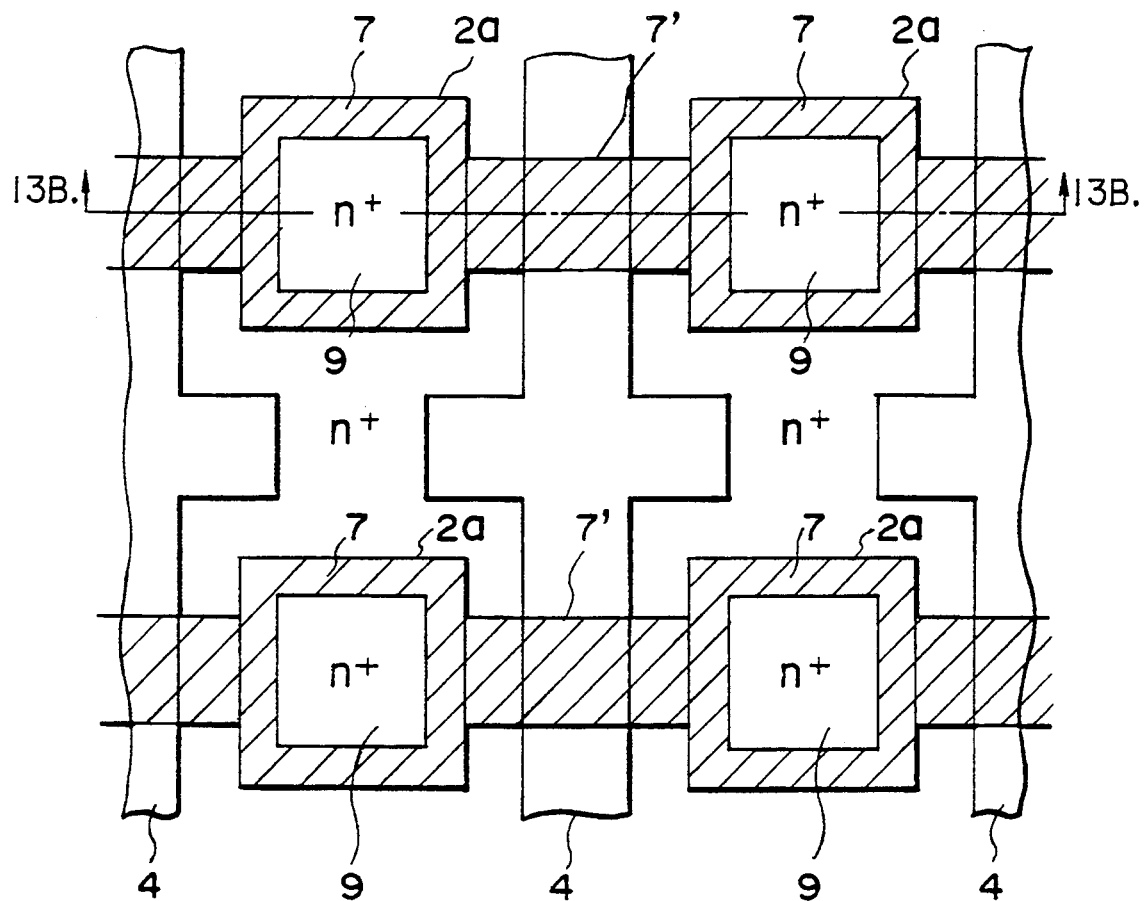
Figure 13B:
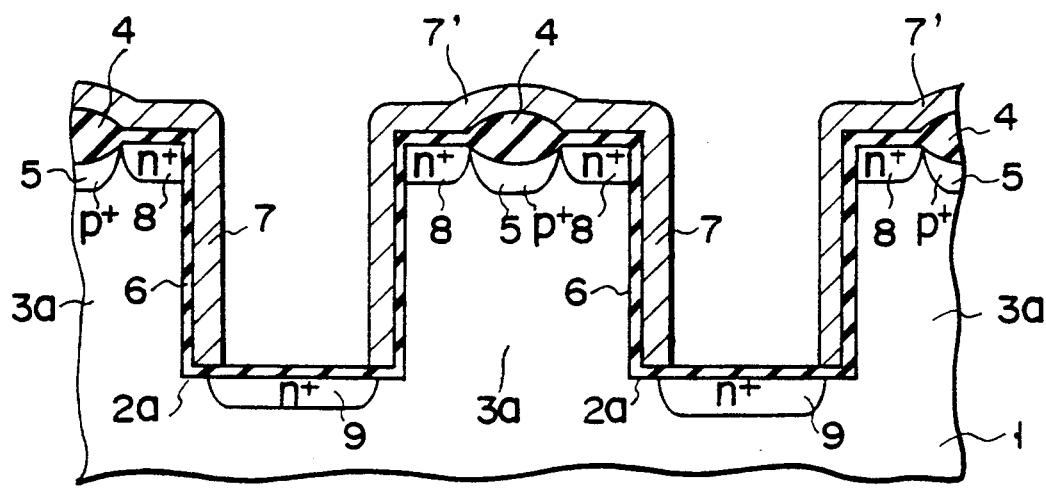

Thereafter, as shown in FIGS. 13A and 13B, on the inner wall of the groove 2a, the gate oxidation film 6 having a thickness of about 20 nm is formed by thermal oxidation. Thereafter, the first polycrystalline silicon film having a thickness of about 100 nm is deposited. The first polycrystalline silicon film is etched by RIE, thereby forming the gate electrode 7 in a state that the gate electrode 7 is self-aligned with the inner wall of the groove 2a. In this case, in etching the first polycrystalline silicon film, there is left the connection portion 7', which is used to make the gate electrode 7 continuous in the x-direction by photolithography. Thereafter, ion-implantation is performed, thereby forming the n-type diffusion layer 9, which serves as a source of MOSFET and extends to the storage node, in the bottom portion of each groove 2a.

Then, as shown in FIGS. 14A and 14B, the surface of the gate electrode 7 is oxidized and covered with the oxidation film 10, and the oxidation film of the bottom portion of the groove 2a is removed by etchant using NH$_4$F. Thereafter, the second polycrystalline silicon film having a thickness of about 20 nm is deposited. The deposited second polycrystalline silicon film is etched by RIE, so that the storage node 11 is buried in the inside of the gate electrode 7. The storage node 11 is self-aligned with the gate electrode 7. However, in this embodiment, in this RIE process, a mask is formed around the groove 2a by photolithography, so that a part of the storage node 11 extends outside of the groove 2a. The bottom portion of the storage node 11 contacts the diffusion layer 9.

Figure 15A:
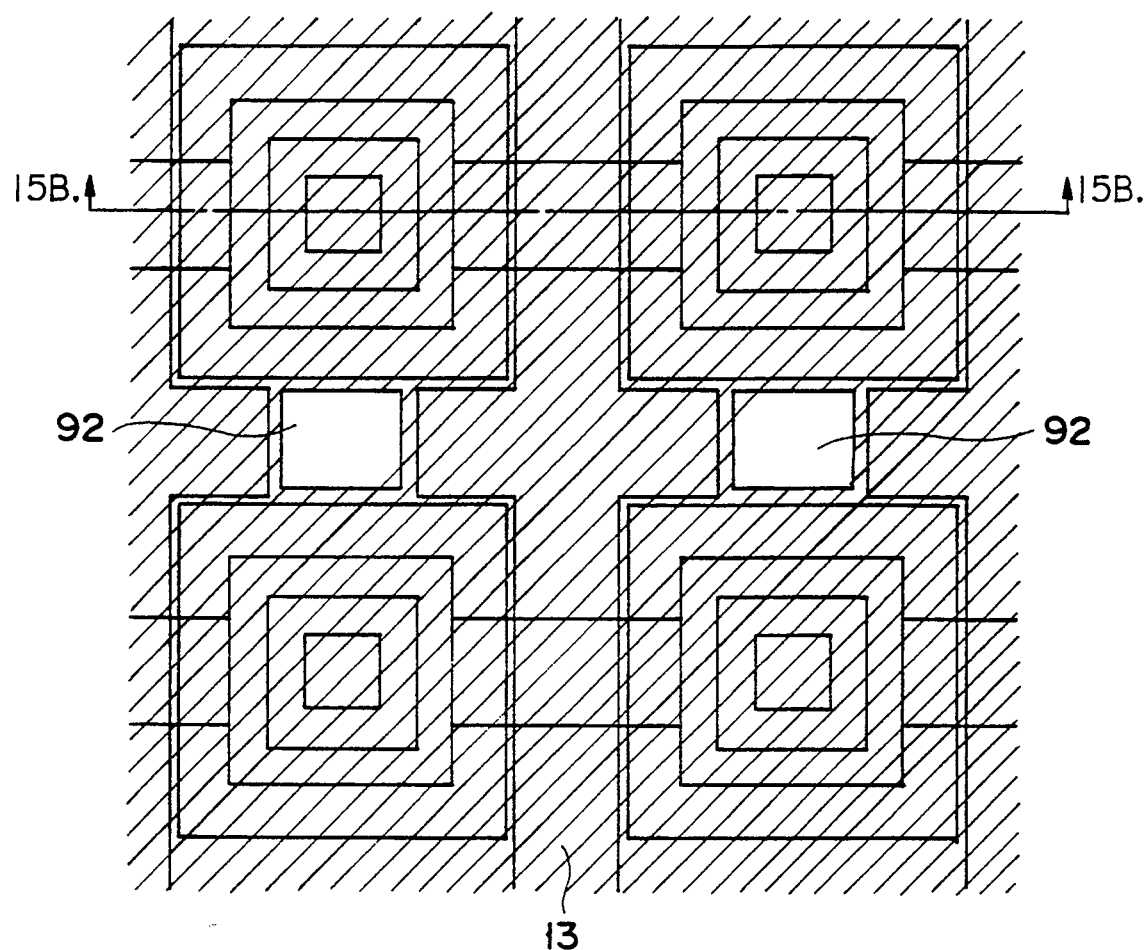
Figure 15B:
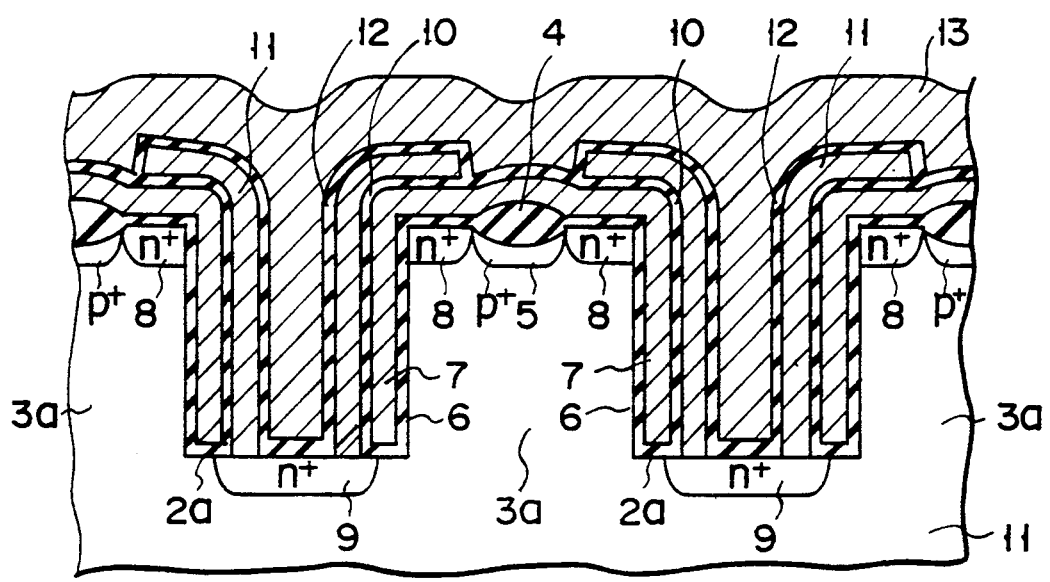

Thereafter, as shown in FIGS. 15A and 15B, on the surface of the storage node 11, the capacitor insulating film 12 is formed by thermal oxidation and deposition of the silicon nitride film. Thereafter, the cell plate 13 is formed of the third polycrystalline silicon film having a thickness of about 30 nm. The cell plate 13 covers substantially the entire surface of the substrate, and is buried in the groove 2a, and opposite to the storage node 11. In the cell plate 13, a window 92 is formed by the photolithography to be used as a contact portion of Al bit line formed in the next process.

Thereafter, as shown in FIGS. 11A and 11B, the interlayer insulating film 14 having a thickness of about 300 nm is formed by CVD. In the interlayer insulating film 14, a contact opening 91, which is overlay on the window 92 of the cell plate 13, is formed, thereafter Al bit line 15 is formed.

The same effect as the previous first to sixth embodiments can be obtained by the seventh embodiment.

Figure 16:
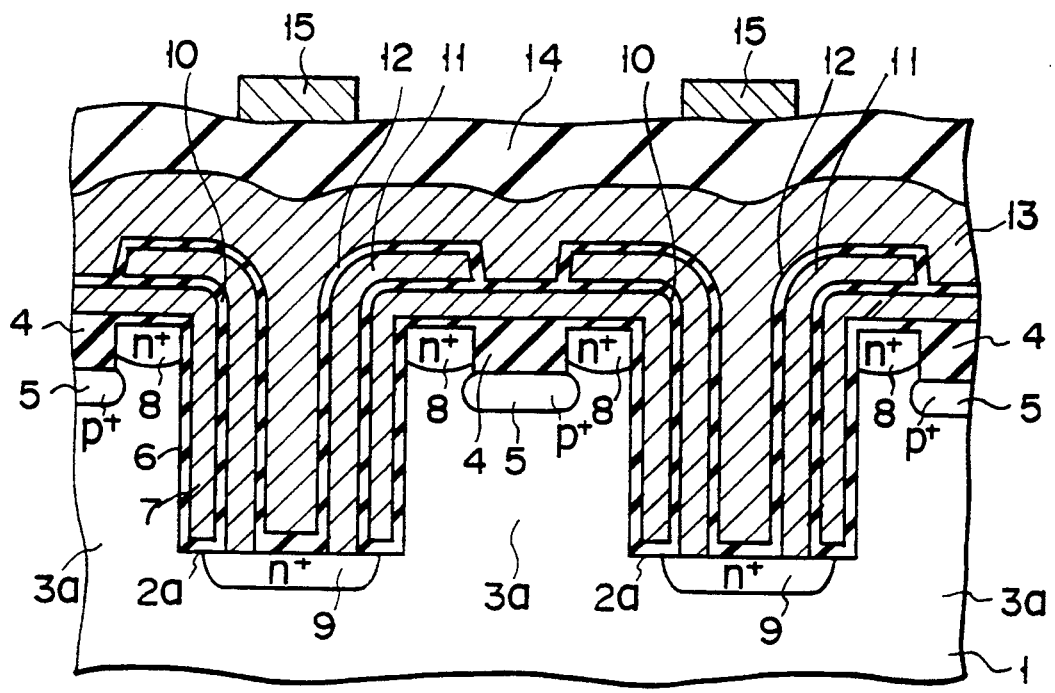
FIG. 16 is a cross sectional view showing a DRAM structure of an eighth embodiment of the present invention.

FIG. 16 is the structure of the DRAM memory of an eighth embodiment, which is shown to correspond to FIG. 11B. In this embodiment, the field oxidation film 4 is formed by not LOCOS method but a burying method.

Figure 17:
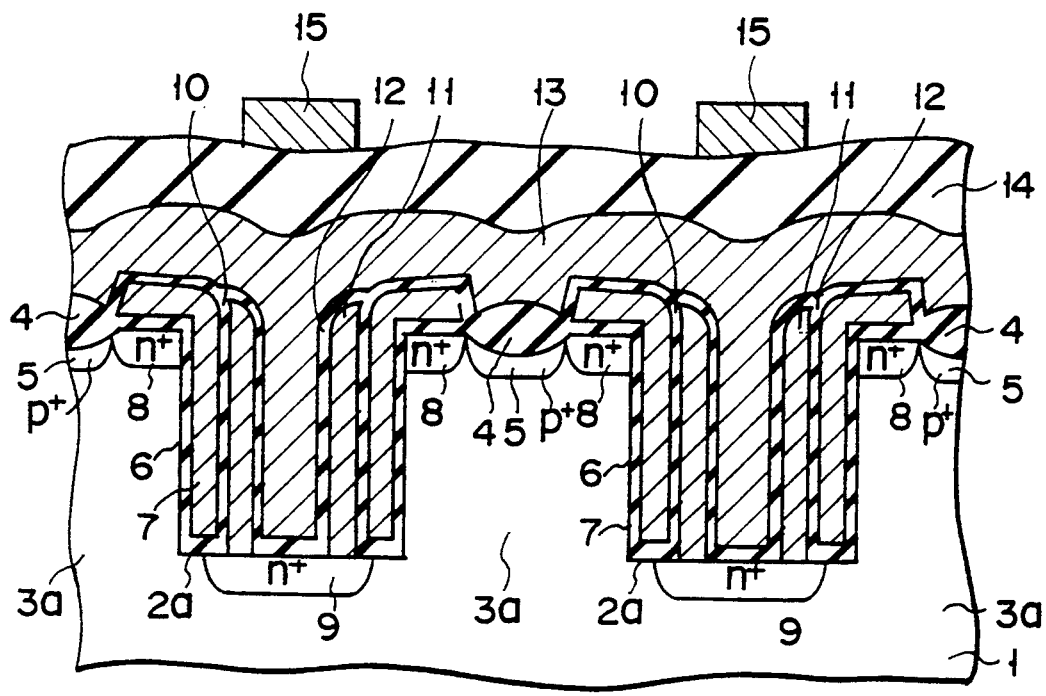
FIG. 17 is a cross sectional view showing a DRAM structure of a ninth embodiment of the present invention.

FIG. 17 is the structure of the DRAM memory of a ninth embodiment, which is shown to correspond to FIG. 11B. In this embodiment, the storage node 11 is not extended to the outside of the groove 2a. The storage node 11 is formed in only the inside of the groove 2a. The capacity of the capacitor of this embodiment is smaller than that of the seventh embodiment. However, the manufacturing process becomes simple. This is because there is no photolithography process for extending the storage node 11 to the outside of the groove 2a.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method for manufacturing a dynamic semiconductor memory device wherein a memory cell includes a MOS transistor and a capacitor around a semiconductor pillar portion, said method comprising the steps of:

forming a plurality of semiconductor pillar portions arranged in a matrix manner by forming a groove extending in first and second directions transverse to each other in a semiconductor substrate;

forming a field isolation region in a central portion of said groove whereby said field isolation region extends along said groove;

forming a gate electrode surrounding each of said semiconductor pillar portions and extending in the first direction of said matrix after forming a gate insulating film around said semiconductor pillar portions;

forming a diffusion layer serving as a source or drain region in a groove bottom portion by use of said gate electrode as a mask;

forming a storage node of said capacitor to surround each of said semiconductor pillar portions where said gate electrode is formed and to contact said diffusion layer after forming an interlayer insulating film on the surface of said gate electrode;

burying a cell plate in said groove after forming a capacitor insulating film on the surface of said storage node;

exposing the upper surface of said semiconductor pillar portion, after covering the upper surface of said cell plate with an interlayer insulating film, to form a diffusion layer serving as a source or drain region on the exposed upper surface; and forming a bit line extending in the second direction of said matrix by contacting the upper surface of said diffusion layer of said semiconductor pillar portions.

2. The method according to claim 1, wherein said step of forming said field isolation region along said groove is performed by thermal oxidization by using a mask material formed around said semiconductor pillar portions.

3. The method according to claim 1, wherein said step of forming said field isolation region along said groove comprises forming a separation groove in the central portion of said groove, and burying said separation groove with low stress material.

* * * * *